US010930707B2

(12) United States Patent
Fratin et al.

(10) Patent No.: US 10,930,707 B2
(45) Date of Patent: Feb. 23, 2021

(54) MEMORY DEVICE WITH A SPLIT PILLAR ARCHITECTURE

(71) Applicant: Micron Technology, Inc., Boise, ID (US)

(72) Inventors: Lorenzo Fratin, Buccinasco (IT); Fabio Pellizzer, Boise, ID (US); Paolo Fantini, Vimercate (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/460,884

(22) Filed: Jul. 2, 2019

(65) Prior Publication Data

US 2021/0005664 A1  Jan. 7, 2021

(51) Int. Cl.
*H01L 45/00* (2006.01)
*H01L 27/24* (2006.01)
*G11C 13/00* (2006.01)

(52) U.S. Cl.
CPC ........ *H01L 27/249* (2013.01); *H01L 27/2436* (2013.01); *H01L 45/06* (2013.01); *H01L 45/141* (2013.01); *H01L 45/1683* (2013.01); *G11C 13/0004* (2013.01); *G11C 13/0028* (2013.01); *G11C 2213/71* (2013.01); *G11C 2213/79* (2013.01)

(58) Field of Classification Search
CPC .... H01L 45/06; H01L 45/141; H01L 45/1683
See application file for complete search history.

(56) References Cited

U.S. PATENT DOCUMENTS

| | | | |
|---|---|---|---|
| 2010/0091558 A1 | 4/2010 | Lee et al. | |
| 2010/0270529 A1 | 10/2010 | Lung | |
| 2016/0133671 A1 | 5/2016 | Fantini et al. | |
| 2017/0373084 A1 | 12/2017 | Shim et al. | |
| 2019/0259946 A1* | 8/2019 | Makala | H01L 45/06 |

FOREIGN PATENT DOCUMENTS

WO  2018208719 A1  11/2018

OTHER PUBLICATIONS

ISA/KR, International Search Report and Written Opinion of the International Searching Authority, Int'l Appl. No. PCT/US2020/038354, dated Sep. 29, 2020, Korean Intellectual Property Office, Seo-gu, Daejeon, Republic of Korea, 15 pgs.

* cited by examiner

*Primary Examiner* — Thomas L Dickey
(74) *Attorney, Agent, or Firm* — Holland & Hart LLP

(57) ABSTRACT

Methods, systems, and devices for memory device with a split pillar architecture are described. A memory device may include a substrate arranged with conductive contacts in a pattern and openings through alternative layers of conductive and insulative material that may decrease the spacing between the openings while maintaining a dielectric thickness to sustain the voltage to be applied to the array. After etching material, an insulative material may be deposited in a trench. Portions of the insulative material may be removed to form openings, into which cell material is deposited. Conductive pillars may extend perpendicular to the planes of the conductive material and the substrate, and couple to conductive contacts. The conductive pillars and cell material may be divided to form a first and second storage components and first and second pillars.

13 Claims, 17 Drawing Sheets

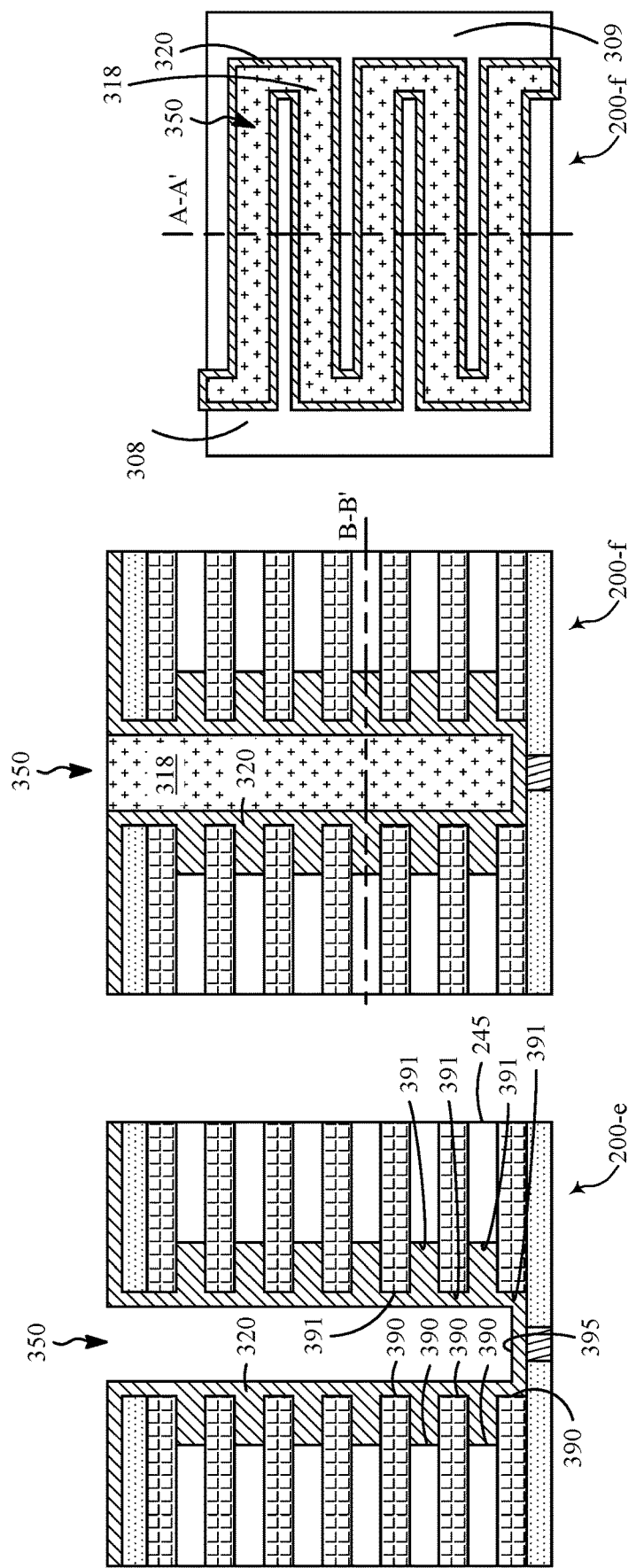

MEMORY DEVICE WITH A SPLIT PILLAR ARCHITECTURE

BACKGROUND

The following relates generally to a system that includes at least one memory device and more specifically to a memory device with a split pillar architecture.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), other chalcogenide-based memories, and others. Memory devices may be volatile or non-volatile.

Improving memory devices, generally, may include increasing memory cell density, increasing read/write speeds, increasing reliability, increasing data retention, reducing power consumption, or reducing manufacturing costs, among other metrics. Solutions for saving space in the memory array, increasing the memory cell density, or decreasing overall power usage of the memory array with three-dimensional vertical architecture may be desired.

BRIEF DESCRIPTION OF THE DRAWINGS

FIGS. 3A through 3E illustrate various views of example memory arrays that support a memory device with a split pillar architecture in accordance with examples as disclosed herein.

DETAILED DESCRIPTION

Figure 1:
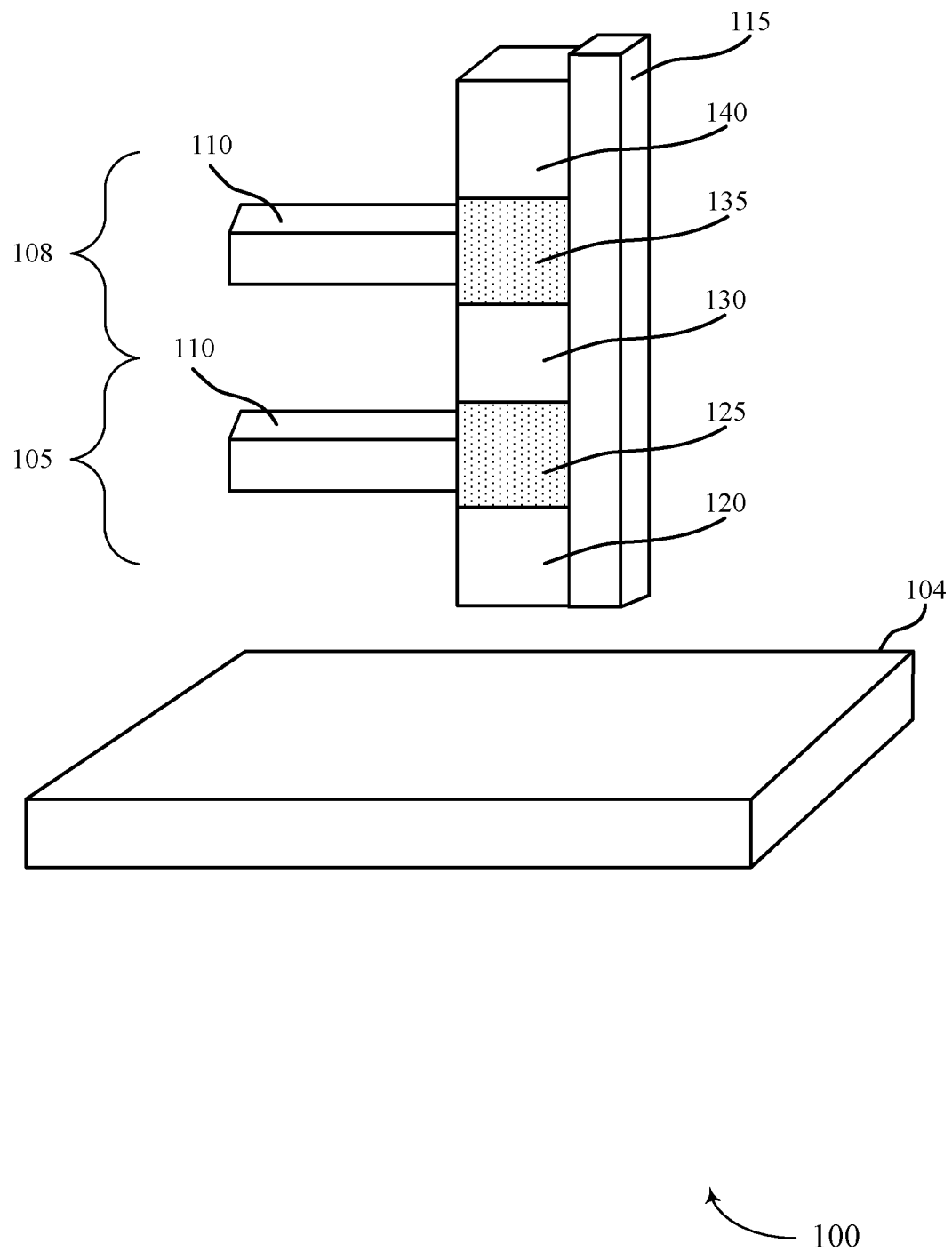
FIG. 1 illustrates an example of a memory array that supports a memory device with a split pillar architecture in accordance with examples as disclosed herein.

The present disclosure relates to a memory device with a split pillar architecture, and methods of processing the same. The memory device may include an arrangement of conductive contacts and openings through alternative layers of conductive materials and insulative material that may decrease the spacing between the memory cells while maintaining a dielectric thickness to sustain the voltage to be applied to a memory array of the memory device.

In some examples, a memory device may include a substrate with a plurality of contacts arranged in a pattern (e.g., a geometric pattern) and a first insulative material (e.g., a dielectric material) formed on the substrate. A plurality of planes of a conductive material may be separated from one another by a second insulative material (e.g., a dielectric material) and formed on the substrate material. The planes of conductive material may be examples of word lines.

During manufacturing of the memory device, a trench may be formed in a shape that separates odd and even word line planes to create "comb" structures (e.g., structures that look like a tool with fingers and space between the fingers). The trench may any geometric configuration and include odd and even groups of fingers of the comb facing one another at a fixed distance. In some examples, the trench may be formed in a serpentine shape. The trench may divide each plane of conductive material into two sections or two plates. Each plate of conductive material may be an example of a word line plate. In some examples, inside the trench, the planes of the conductive material may be etched in such a way that the dielectric materials and the conductive materials form a plurality of recesses, where each recess may be configured to receive a storage element material (e.g., a chalcogenide material). A sacrificial layer (e.g., a conformal material) may be deposited in the trench and, in some cases, the sacrificial layer fills the recesses. An insulative material may be deposited in the trench on top of the sacrificial layer. The sacrificial layer and the insulative layer may form a serpentine shape. In some examples, other geometric configurations of the trench are contemplated.

Portions of the sacrificial layer and the insulative may be removed to form first openings. The first openings may expose portions of the substrate, the plurality of conductive contacts, and portions of the conductive materials and dielectric materials. A storage element material (e.g., the chalcogenide material) may be deposited in the first openings. The storage element material may fill the recesses formed by the dielectric materials and the conductive materials. The storage element material may be partially removed from the first openings such that the storage element materials in the recesses remain.

Conductive pillars may be formed in the first openings that include the storage element materials in the recesses. The conductive pillars may be examples of a digit lines. The conductive pillars may be arranged to extend (e.g., substantially perpendicular) to the planes of the conductive material and the substrate. Each conductive pillar may be coupled with a different conductive contact. The pillars may be formed of a barrier material and a conductive material.

Portions of the storage element materials and the conductive pillars may be removed to form second openings. The second openings may divide each storage element material in the recess into a first storage element component and a second storage element component. The second openings may further divide each pillar into a first pillar and a second pillar. In some cases, each of the first pillars and the second pillars may be coupled with a different conductive contact on the substrate. In some other cases, each of the first pillars may be coupled with a different conductive contact on the substrate and each of the second pillars may be coupled with a different conductive contact on a second substrate formed above the first substrate.

Such configurations of a memory array and the methods of manufacturing may allow a higher-density of memory cells relative to previous solutions. Each memory cell (e.g., storage element material) may be recessed inside opposite sides of either a first pillar or a second pillar to ensure the cell isolation. Such a configuration may allow for a tighter control of cell thickness and dimension with respect to some previous solutions. Each plane of conductive material that intersects the conductive pillar may form two memory cells addressed by a first word line plate in the plane and a second word line plate in the plane. Each first pillar and second pillar pair may form two memory cells addressed by the first pillar and the second pillar respectively. Each pillar may be decoded by a transistor positioned at the bottom or top of the memory array. The transistor may be an example of a digit line selector formed in a regular matrix.

Features of the disclosure are initially described in the context of a memory array as described with reference to FIG. 1. Features of the disclosure are described in the context of different views of example memory arrays during processing steps as described with reference to FIGS. 2A-7B. These and other features of the disclosure are further illustrated by and described with reference to flowcharts that relate to a memory device with a split pillar architecture as described with references to FIGS. 8-11.

FIG. 1 illustrates an example of a memory array 100 (e.g., a three-dimensional (3D) memory array) that supports a memory device with a split pillar architecture in accordance with examples as disclosed herein. Memory array 100 may include a first array or deck 105 of memory cells that is positioned above a substrate 104 and a second array or deck 108 of memory cells on top of the first array or deck 105.

Memory array 100 may include word lines 110 and digit lines 115. Memory cells of the first deck 105 and the second deck 108 each may have one or more self-selecting memory cells. Although some elements included in FIG. 1 are labeled with a numeric indicator, other corresponding elements are not labeled, though they are the same or would be understood to be similar.

A stack of memory cells may include a first dielectric material 120, a storage element material 125 (e.g., chalcogenide material), a second dielectric material 130, a storage element material 135 (e.g., chalcogenide material), and a third dielectric material 140. The self-selecting memory cells of the first deck 105 and second deck 108 may, in some examples, have common conductive lines such that corresponding self-selecting memory cells of each deck 105 and 108 may share digit lines 115 or word lines 110.

In some examples, a memory cell may be programmed by providing an electric pulse to the cell, which may include a memory storage element. The pulse may be provided via a first access line (e.g., word line 110) or a second access line (e.g., digit line 115), or a combination thereof. In some cases, upon providing the pulse, ions may migrate within the memory storage element, depending on the polarity of the memory cell. Thus, a concentration of ions relative to the first side or the second side of the memory storage element may be based at least in part on a polarity of a voltage between the first access line and the second access line. In some cases, asymmetrically shaped memory storage elements may cause ions to be more crowded at portions of an element having more area. Certain portions of the memory storage element may have a higher resistivity and thus may give rise to a higher threshold voltage than other portions of the memory storage element. This description of ion migration represents an example of a mechanism of the self-selecting memory cell for achieving the results described herein. This example of a mechanism should not be considered limiting. This disclosure also includes other examples of mechanisms of the self-selecting memory cell for achieving the results described herein.

The architecture of memory array 100 may be referred to as a cross-point architecture, in some cases, in which a memory cell is formed at a topological cross-point between a word line 110 and a digit line 115. Such a cross-point architecture may offer relatively high-density data storage with lower production costs compared to other memory architectures. For example, the cross-point architecture may have memory cells with a reduced area and, resultantly, an increased memory cell density compared to other architectures.

While the example of FIG. 1 shows two memory decks 105 and 108, other configurations are possible. In some examples, a single memory deck of self-selecting memory cells may be constructed above a substrate 104, which may be referred to as a two-dimensional memory. In some examples, a three or four memory decks of memory cells may be configured in a similar manner in a three-dimensional cross point architecture.

The memory array 100 may include a substrate 104 with a plurality of contacts arranged in a grid or staggered pattern. In some cases, the plurality of contacts may extend through the substrate and couple with an access line of the memory array 100. The memory array 100 may include an additional substrate 104 (e.g., positioned above the two decks 105 and 108. The additional substrate 104 may have a plurality of contacts (e.g., extending through the substrate) and coupled with an access line of the memory array 100.

The memory array 100 may include a plurality of planes of a conductive material separated by one another by a second insulative material formed on the first insulative material on the substrate material. Each of the plurality of planes of the conductive material may include a plurality of recesses formed therein. The plurality of planes, for example, word line plates corresponding to one or more word lines 110 on a same deck (e.g., memory deck 105, memory deck 108), may be obtained by a replacement process by using a sacrificial layer (e.g., a conformal layer) for etching during a stack deposition processing step, removing the conformal layer after cell definition and replacing the conformal layer with a more conductive material.

An insulative material may be formed in a serpentine shape through the second insulative material and the conductive material. A plurality of conductive pillars may be formed in openings to extend substantially perpendicular to the plurality of planes of the conductive material and the substrate. The plurality of conductive pillars may be divided into a plurality of pillar pairs. Each pillar in the pair of pillars may be coupled to a different one of the conductive contacts. In some cases, each pillar in the pair of pillars may be coupled to a conductive contact on substrate 104. Additionally or alternatively, one pillar of each pair of pillars may be coupled to a conductive contact on the substrate 104 and the other pillar of each pair of pillars may be coupled to a conductive contact on a different substrate 104 (e.g., positioned above the memory decks 105 and 108).

In some examples, the memory decks 105 and 108 may include chalcogenide material configured to store logic states. For example, the memory cells of the memory decks 105 and 108 may be examples of self-selecting memory cells. A chalcogenide material may be formed in the plurality of recesses such that the chalcogenide material in each respective one of the plurality of recesses is at least partially in contact with one pillar of the plurality of pairs of pillars.

Figure 2A:
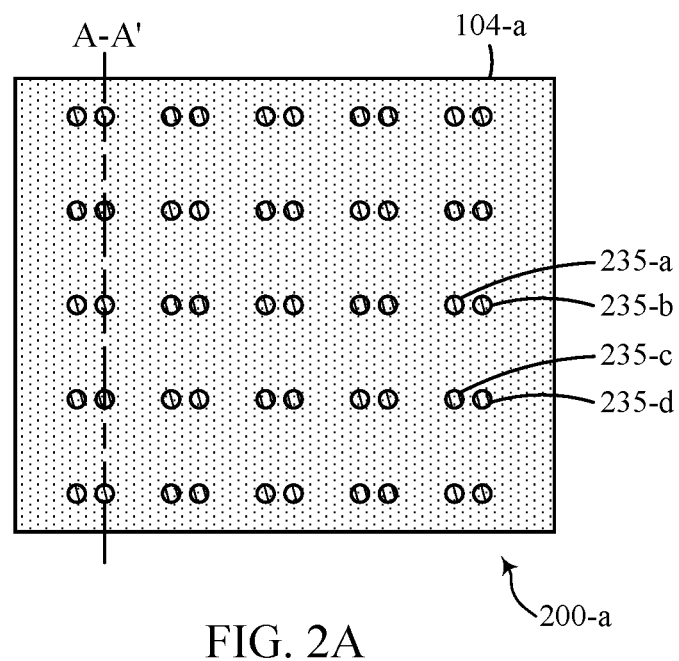
FIGS. 2A through 2C illustrate various views of example memory arrays that support a memory device with a split pillar architecture in accordance with examples as disclosed herein.

FIG. 2A illustrates bottom view of an example memory array 200-a in accordance with examples as disclosed herein. The memory array 200-a may include a plurality of conductive contacts 235 formed in a substrate 104-a that extend through the substrate 104-a and couple with an access line of the memory array 100. The substrate 104 may be a dielectric material, such as a dielectric film.

A single conductive contact of the plurality of conductive contacts 235 may be configured to couple any single vertical pillar with a transistor. For example, conductive contact 235-a may couple a first pillar of a pair of pillars (e.g., corresponding to a digit line) to a transistor and contact 235-b may couple a second pillar of the pair of pillars to a transistor. Contacts 235-c and 235-d may each couple one pillar of a second pair of pillars to transistors. The plurality of conductive contacts 235 may be arranged in a grid pattern. In some examples, a respective one of the plurality of conductive contacts 235 may be surrounded by up to eight other conductive contacts 235. In some examples, the plurality of conductive contacts 235 may be arranged in a staggered pattern or a hexagonal pattern. For example, a respective one of the plurality of conductive contacts 235 may be surrounded by up to six other conductive contacts 235.

Figure 2B:
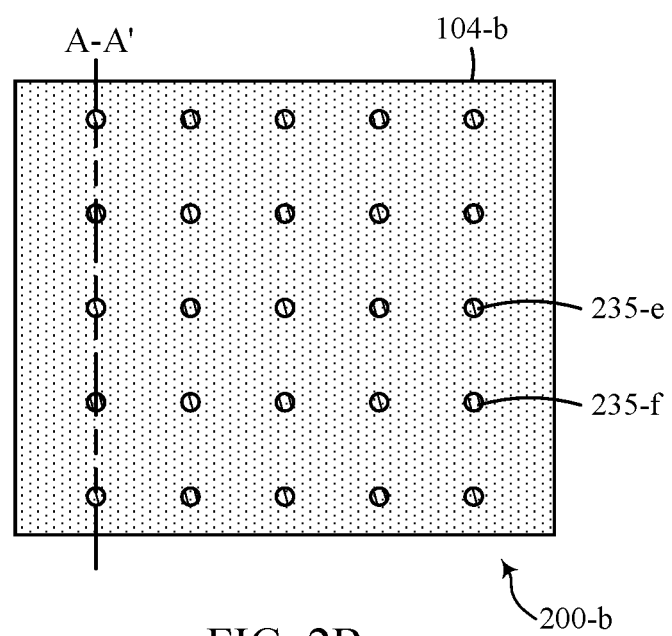

FIG. 2B illustrates a bottom view of an example memory array 200-b in accordance with examples as disclosed herein. The memory array 200-b may include a second substrate 104 positioned on top of the memory array 200-b. For example, the second substrate 104 may be positioned on the opposite side of one or more memory decks of the memory array 200-b). Each substrate (e.g., substrate 104-b and the second substrate) may include a plurality of conductive contacts 235 formed in a substrate 104-b that extend through the substrate 104 and couple with an access line of the memory array 100.

A single conductive contact of the plurality of conductive contacts 235 may be configured to couple any single vertical pillar with a transistor. For example, conductive contact 235-e may couple a first pillar of a pair of pillars (e.g., corresponding to a digit line) to a transistor. A second conductive contact on the second substrate may couple a second pillar of the pair of pillars to a transistor. Contact 235-f and a fourth conductive contact on the second substrate may each couple one pillar of a second pair of pillars to transistors. The plurality of conductive contacts 235 may be arranged in a grid pattern. In some examples, a respective one of the plurality of conductive contacts 235 may be surrounded by up to eight other conductive contacts 235. In some examples, the plurality of conductive contacts 235 may be arranged in a staggered pattern or a hexagonal pattern. For example, a respective one of the plurality of conductive contacts 235 may be surrounded by up to six other conductive contacts 235.

Figure 2C:
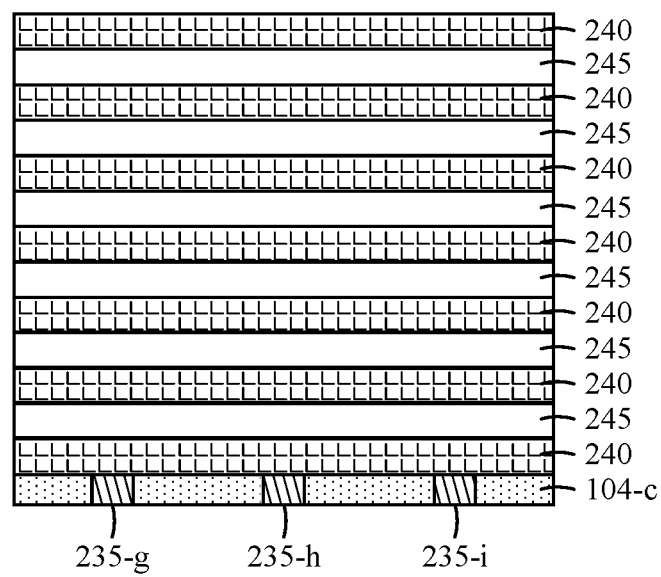

FIG. 2C illustrates a side view of an example memory array 200-c in accordance with examples as disclosed herein. The memory array 200-c may include plurality of conductive contacts 235 may be formed in the substrate 104-c. The memory array 200-c may also include a plurality of stacked planes of an insulative material 240 and a plurality of stacked planes of a material 245 (e.g., word lines planes or word line plates). The stacked planes of material 245 may be separated in a z-direction (e.g., separated vertically) from one another by the plurality of planes of the insulative material 240. For example, a first plane (e.g., a bottom plane) of the second insulative material 240 may be formed (e.g., deposited) on the plane of the substrate 104-c, and then a plane of the material 245 may be formed on the first plane of the second insulative material 240. In some examples, a layer of the first insulative material 240 may be deposited on the substrate 104-c. In some examples, the material 245 may be a layer of conductive carbon or other conductive layer compatible with active materials. In some examples, the material 245 may include conductive layers separated by active material through a protective barrier. The material 245 may be configured to function as at least one word line plate. In some other examples, the material 245 may include a second insulative material (e.g., different than insulative material 240). In some examples, the material 245 and the insulative material 240 form a plurality of layers, such as alternating layers.

Additional planes of the second insulative material 240 may be formed on the material 245 in an alternating manner as illustrated in FIG. 2C. The second insulative material 240 may be a dielectric material, such as a dielectric film or layer. In some examples, the second insulative material 240 and the substrate 104-c may be the same type of insulative material. Examples of the insulative materials disclosed herein include, but are not limited to dielectric materials, such as silicon oxide.

Each respective one of the plurality of planes of the material 245 may be at (e.g., form) a different level of the memory array 200-c. Individual planes of material that form memory cells may be referred to as a deck of the 3D memory array 200-b. In some instances, the material 245 may be a conductive material. Here, the material 245 may comprise (e.g., be formed of) a metallic (or semi-metallic) material or a semiconductor material such as a doped polysilicon material, among others. In some examples, the material 245 may be a plane of conductive carbon. In some other instances, the material 245 may be a sacrificial insulative material. Here, the memory array 200-c may include a set of stacked planes of the sacrificial insulative material 245 and a set of stacked planes of the insulative material 240. The sacrificial insulative material 245 may be a different material than the insulative material 240 (e.g., an oxide material and a nitride material, respectively). During a process step subsequent to what is illustrated in FIG. 2C, the sacrificial insulative material 245 may be removed and replaced by a conductive material (e.g., a layer of conductive carbon or other conductive layer compatible with active materials).

Six planes of the material 245 and seven planes of the second insulative material 240 are shown in FIG. 2C. The seventh plane of the second insulative material 240 may be a topmost layer of the memory array 200-c. The quantity of planes of the material 245 and the second insulative material 240 are not limited to the quantities illustrated in FIG. 2C. The material 245 and the second insulative material 240 may be arranged into more than six decks or less than six decks.

FIGS. 3A-3E illustrate various views of example memory arrays 200-c, 200-d, 200-e, and 200-f during a series of steps or processes that may be performed to form a stacked memory device, in accordance with examples as disclosed herein. Specifically, in FIGS. 3A-3E, a process of forming even and odd word line planes is shown.

Figure 3A:
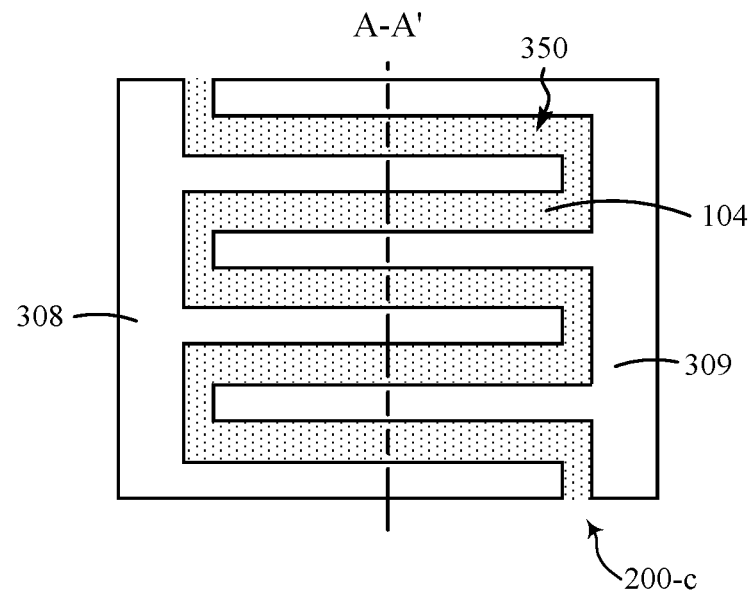
Figure 3B:
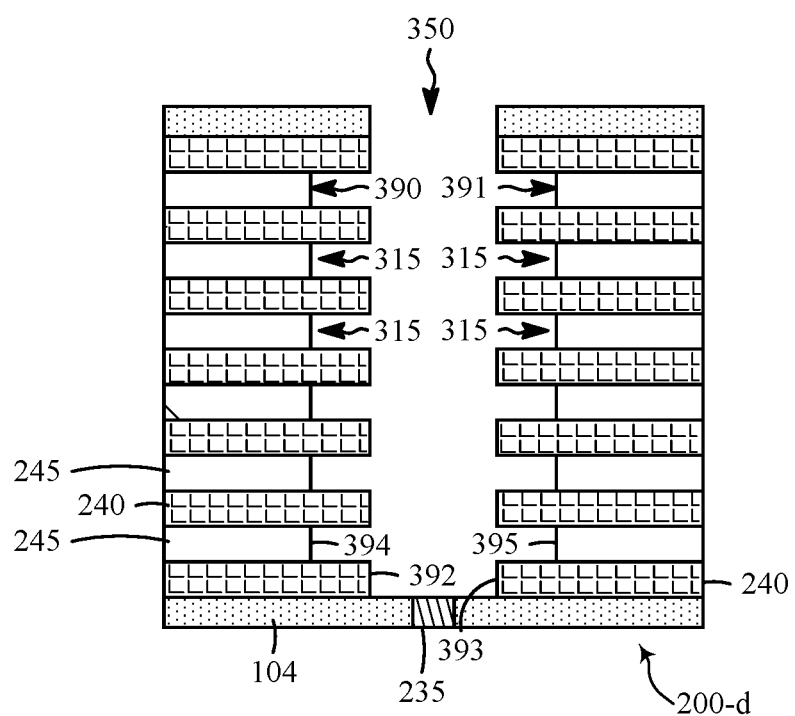

FIG. 3A illustrates a top view of an example memory array 200-c, which may be an example of the memory array 200-b illustrated in FIG. 2C after a trench 350 is formed. FIG. 3B illustrates a cross-sectional view of an example memory array 200-d along section line A-A' during a process step subsequent to what is illustrated in FIG. 3A. FIG. 3C illustrates a cross-sectional view of an example memory array 200-e along section line A-A' during a process step subsequent to what is illustrated in FIG. 3B. FIG. 3D illustrates a cross-sectional view of an example 3D memory array 200-f along section line A-A' during a process step subsequent to what is illustrated in FIG. 3C. FIG. 3E illustrates a top view of an example 3D memory array 200-f of section line B-B' during a process step subsequent to what is illustrated in FIG. 3C. FIGS. 3A through 3E illustrate a series of steps or processes that may be performed to form a stacked memory device.

FIG. 3A illustrates forming the trench 350 through the alternating planes of material 245 (e.g., a conductive material, an insulative material as shown in FIG. 3B) and the second insulative material 240 (shown in FIG. 3B) of memory array 200-c. The trench 350 may expose the substrate 104 and the conductive contacts 235 (previously shown in FIGS. 2A through 2C) at the bottom of the trench 350.

The trench 350 may be etched from top to bottom and etched in a serpentine-shape. For instance, the trench 350 may pass over a row of the conductive contacts 235 in a first direction (e.g., from left to right) and then pass over an adjacent row of the conductive contacts 235 in a second direction that is opposite to the first direction (e.g., from right to left). With reference to the example of FIG. 3A, the trench 350 passes over a first row of the conductive contacts 235 from left to right, then "turns" and passes over the next (second) row of conductive contacts 235 (adjacent to the first row) from right to left. The trench 350 "turns" again and passes over the next (third) row of conductive contacts 235 (adjacent to the second row) from left to right. The trench 350 "turns" again and passes over the next (fourth) row of conductive contacts 235 (adjacent to the third row) from right to left and then "turns" again and passes over the next (fifth) row of conductive contacts 235 at the bottom of FIG. 3A (adjacent to the fourth row) from left to right.

The trench 350 may bifurcate each plane of the material 245 into at least two portions: a first portion 308 and a second portion 309. Each portion of a plane of the material 245 may be a different access line (e.g., even word line or odd word line) of a deck. For example, the first portion 308 may be a first access line of a deck of the 3D memory array 200-c and the second portion 309 may be a second access line of the same deck of the 3D memory array 200-c. The extension of the fingers forming the even or odd planes may be defined based on the resistivity of an electrode used and by the level of current delivery requested. Specifically, the depth of the recesses may be defined depending on the thickness desired for the memory cell. In some cases, the material 245 may be a conductive material for the different access line. Additionally or alternatively, the material 245 may be a sacrificial insulative material which may be replaced by a conductive material for the different access line during a process step subsequent to the process step illustrated at FIG. 3A.

FIG. 3B illustrates forming a plurality of recesses 315 in the material 245 in each of the planes of memory array 200-d. For example, a selective etching operation may be performed to form the plurality of recesses 315 in sidewalls 390 and 391 of the trench 350 in an isotropic way. In some examples, the trench 350 includes a first sidewall 390 spaced apart from a second sidewall 391, where a first portion 392 of the first sidewall 390 formed by the first insulative material 240 is spaced apart from a first portion 393 of the second sidewall 391 formed by the first insulative material 240 by a first distance. A second portion 394 of the first sidewall 390 formed by the first material 245 may be spaced apart from a second portion 395 of the second sidewall 391 formed by the first material 245 by a second distance greater than the first distance. In some examples, portions of sidewalls 390 and 391 of the trench 350 formed by the first material 245 are recessed relative to portions of the sidewalls 390 and 391 of the trench 350 formed by the first insulative material 240.

The etching operations may include one or more vertical etching processes (e.g., an anisotropic etching process or a dry etching process, or a combination thereof) or horizontal etching processes (e.g., an isotropic etching process) or combinations thereof. For example, a vertical etching process may be performed to vertically etch the trench 350 and a horizontal etching process may be used to form at least one recess 315 in at least one material 245. The etching parameters may be selected such that the material 245, for example, is etched faster than the second insulative material 240. In some cases, the trench 350 may be vertical. In some other cases, the trench 350 may include sloped sidewalls (e.g., be substantially vertical). For example, the trench 350 may be a V-shaped trench such that the trench 350 is wider at a top portion of the trench 350 when compared to a bottom portion of the trench 350. Here, the sidewalls 390 and 391 may be farther apart from each other than sidewalls 394 and 395.

FIG. 3C illustrates forming a conformal material 320 (e.g., a sacrificial material or sacrificial layer). The conformal material 320 may be deposited into the trench 350 of memory array 200-e. The conformal material 320 may be formed in the recesses 315 (shown in FIG. 3B) by conformally depositing the conformal material 320. The conformal material 320 contacts a first sidewall 390, a second sidewall 391, and a bottom wall 395 of each trenches 350. Although FIG. 3C shows the conformal material 320 may be formed on the sidewalls of the trench 350 (e.g., on the surfaces of the second insulative material 240 and the materials 245 in different layers facing into the trench 350) during formation of the conformal material 320 in the plurality of recesses 315, examples are not so limited. For example, the conformal material 320 may be confined to the plurality of recesses 315 in the materials 245 in different layers in some cases. In some cases, the conformal material 320 may be referred to as a conformal layer or a sacrificial layer.

In some cases, an etching operation may be performed subsequent to forming the conformal material 320. In the etching operation, the conformal material 320 may be etched to form an opening or trench 350. The etch operation may result in the surfaces of the conformal material 320 (e.g., the surfaces facing the trench 350) being spaced apart from the surfaces of the second insulative material 240 (e.g., the surfaces facing into the trench 350). In some cases, the etch operation may result in the surfaces of the conformal material 320 (e.g., the surfaces facing the trench 350) being approximately coplanar with surfaces of the second insulative material 240 (e.g., the surfaces facing into the trench 350), and thereby forming a continuous sidewall of trench 350. The etching operations described herein may be vertical etching processes (e.g., an anisotropic etching process or a dry etching process, or a combination thereof) or horizontal etching processes (e.g., an isotropic etching process). For example, a vertical etching process may be performed to vertically etch the trench 350 and a horizontal etching process may be used to form at least one recess in the first material 245.

FIG. 3D illustrates depositing a dielectric material 318 in the trench 350 on top of the conformal material 320 of the memory array 200-f. The dielectric material 318 may contact the conformal material 320. The dielectric material 318 and the conformal material 320 may cooperate to fill the trench 350. In some cases, the dielectric material 318 may be an example of an insulative material. In some examples, the conformal material 320 may be etched back selectively to form a co-planar surface with the dielectric material 318. The depth of the recession may be defined depending on a desired thickness.

FIG. 3E illustrates a top view of an example memory array 200-f after the dielectric material 318 is deposited (as shown in FIG. 3D), in accordance with examples as disclosed herein. FIG. 3E illustrates a cross-sectional view of memory array 200-f along section line B-B' illustrated in FIG. 3D. In FIG. 3E, the conformal material 320 formed in the trench 350 and the dielectric material 318 bifurcates each plane of the material 245 into a first portion 308 and a second portion 309.

FIGS. 4A-4G illustrate various views of example memory arrays 200-g, 200-h, 200-i, 200-j, and 200-k during a series of steps or processes that may be performed to form a stacked memory device, in accordance with examples as disclosed herein. Specifically, FIGS. 4A through 4G illustrate processes for forming memory cells in the memory array 200-f illustrated in FIGS. 3D and 3E.

Figure 4A:
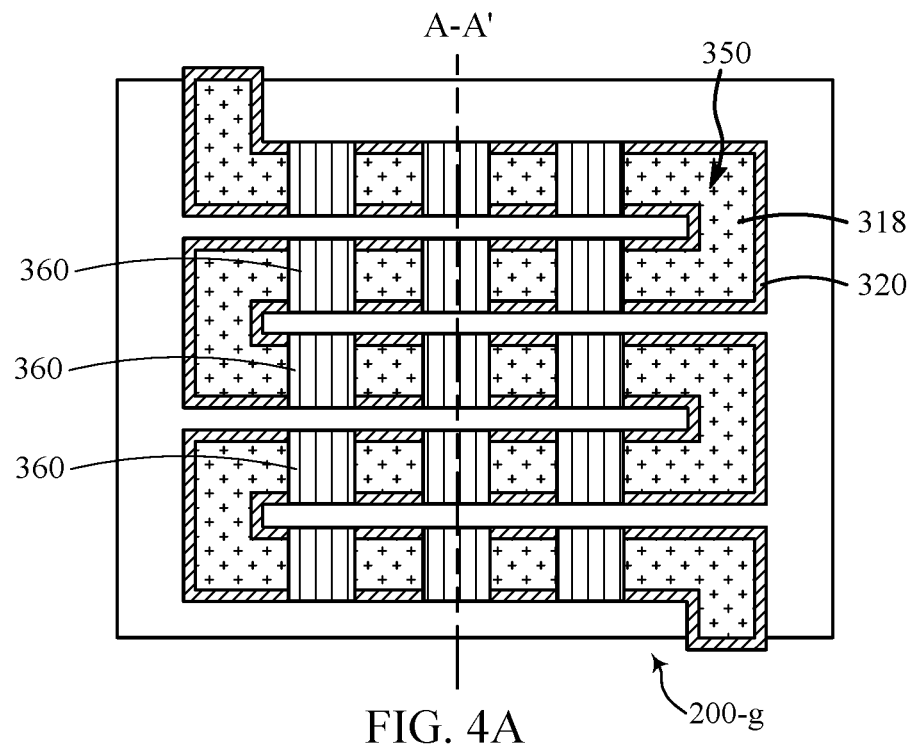
FIGS. 4A through 4G illustrate various views of example memory arrays that support a memory device with a split pillar architecture in accordance with examples as disclosed herein.
Figure 4B:
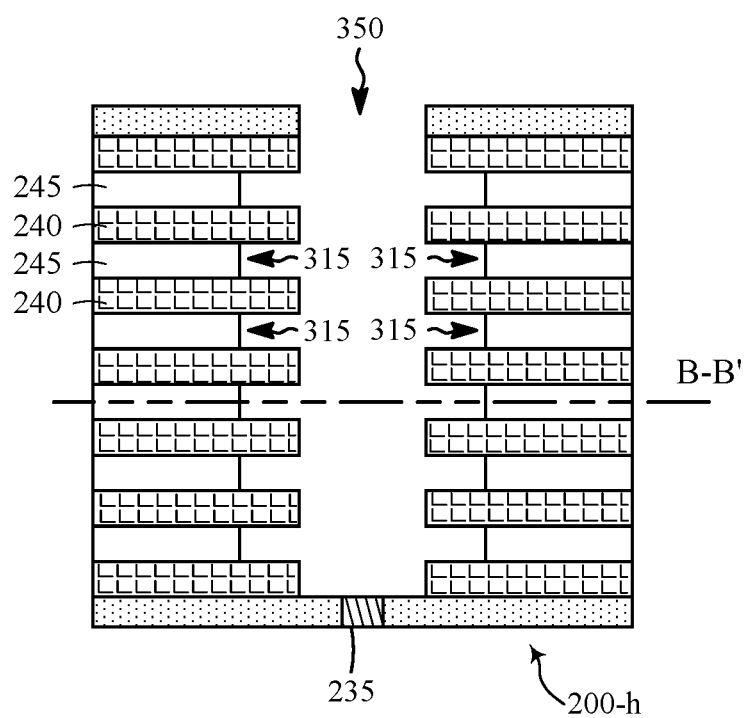
Figure 4C:
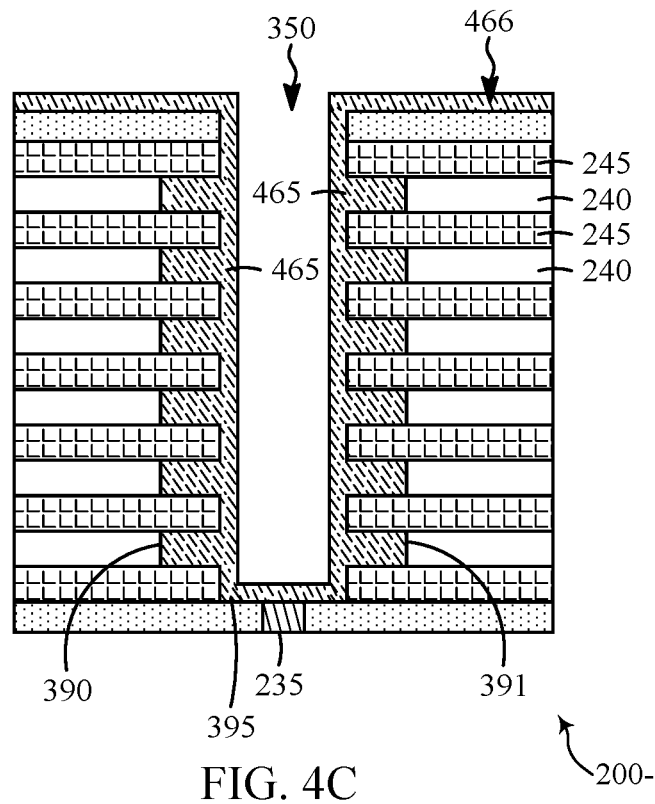
Figure 4D:
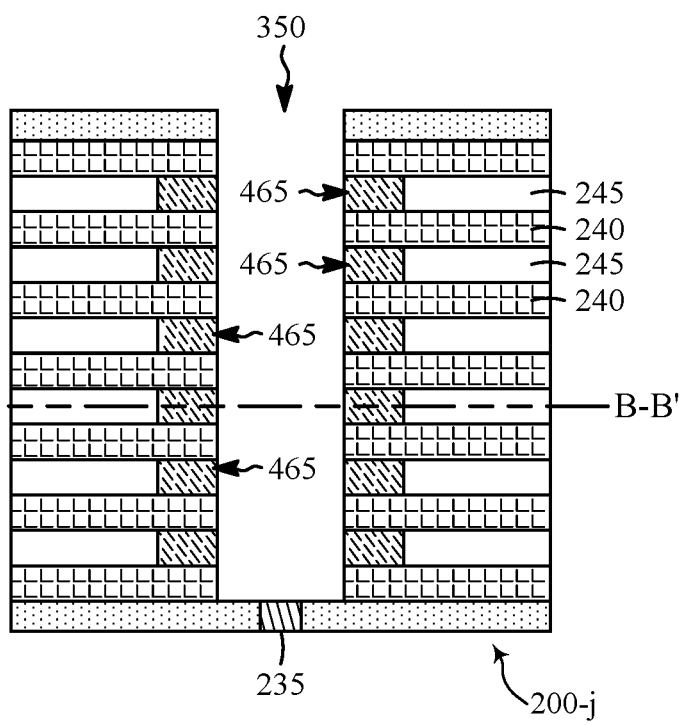
Figure 4E:
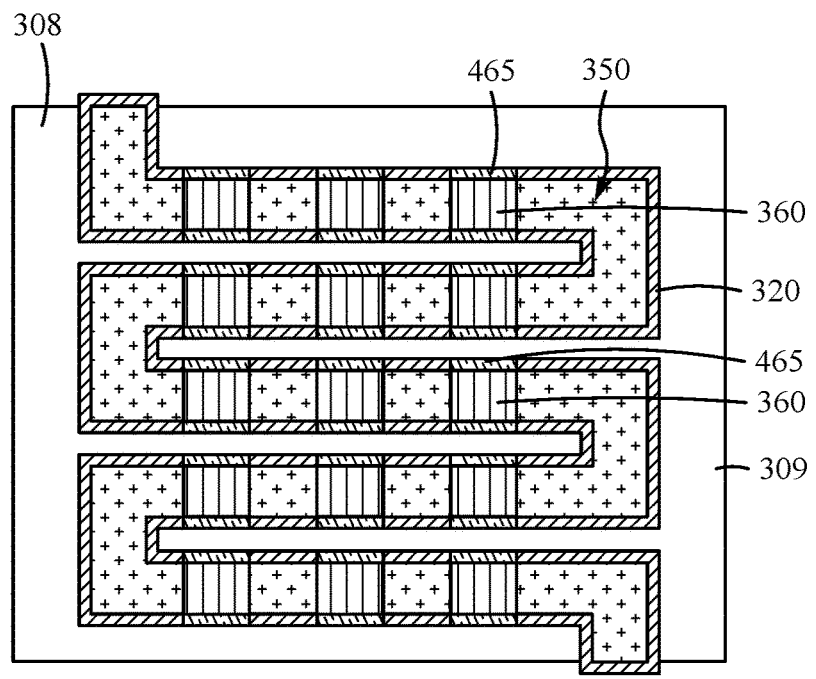
Figure 4F:
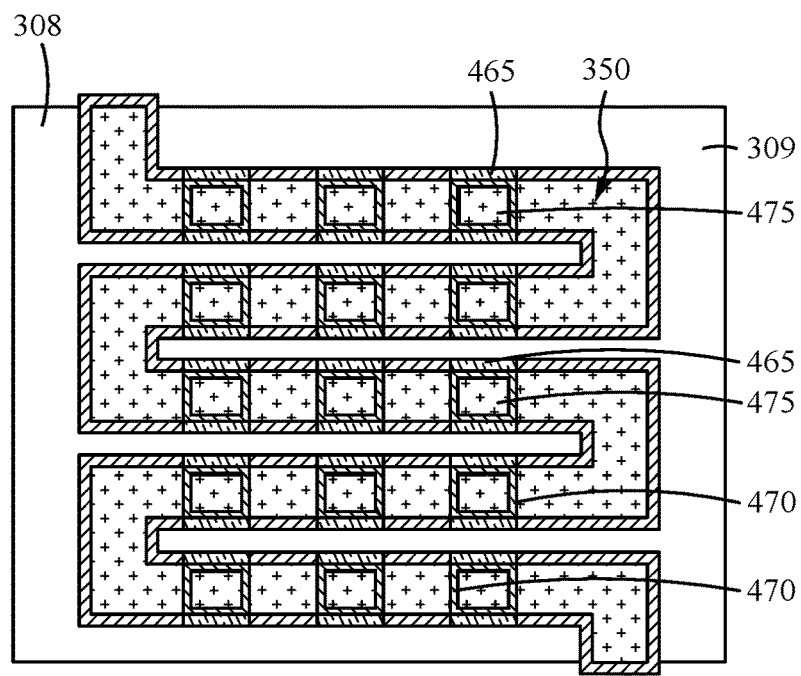
Figure 4G:
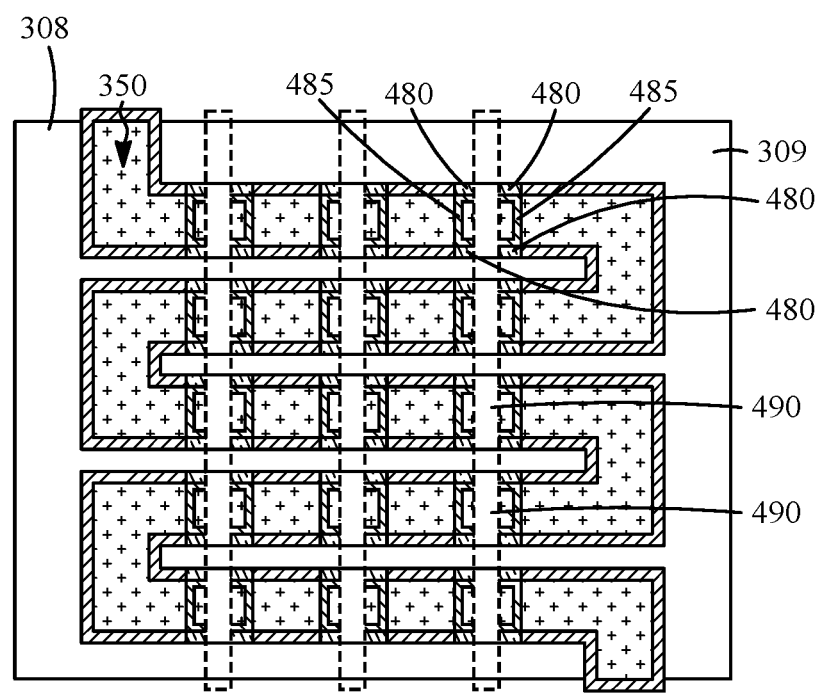

FIG. 4A illustrates a top view of a memory array 200-g, which may be an example of the memory array 200-f illustrated in FIG. 3E after formation of openings 360. FIG. 4B illustrates a cross-sectional view of an example memory array 200-h along section line A-A' during a process step subsequent to what is illustrated in FIG. 4A. FIG. 4C illustrates a cross-sectional view of an example memory array 200-i along section line A-A' during a process step subsequent to what is illustrated in FIG. 4B. FIG. 4D illustrates a cross-sectional view of an example memory array 200-j along section line A-A' during a process step subsequent to what is illustrated in FIG. 4C. FIG. 4E illustrates a top view of the example memory array 200-j of section line B-B' during a process step subsequent to what is illustrated in FIG. 4C. FIG. 4F illustrates a top view of the example memory array 200-k of section line B-B' during a process step subsequent to what is illustrated in FIG. 4E. FIG. 4G illustrates a top view of the example memory array 200-1 of section line B-B' during a process step subsequent to what is illustrated in FIG. 4F.

FIG. 4A illustrates a top view through any one of the planes of the material 245 of the memory array 200-g. A plurality of openings 360 in a trench 350 may be formed by etching away a portion of the dielectric material 318 and/or the conformal material 320. The openings 360 are intended to be positioned in alignment with the plurality of contacts 235 so that forming the openings 360 exposes at least a portion of a plurality of contacts 235 (shown in FIG. 4B) extending through the substrate 104 (shown in FIG. 4B). The etching process may be a vertical etching process. In some examples, the etching operation may not etch away all portions of the conformal material 320, for example, where the plurality of openings 360 are not formed.

FIG. 4B illustrates a cross-sectional view of an example memory array 200-h in accordance with examples as disclosed herein. As shown in FIG. 4B, a plurality of recesses 315 may be formed in the material 245 in each of the planes. For example, a selective etching operation may be performed to form the plurality of recesses 315 in a full or partially isotropic way. The etching chemistry may be selected to selectively reach a material 245. The contacts 235 may be exposed by forming the openings 360 in the trench 350.

FIG. 4C illustrates a cross-sectional view of an example memory array 200-i in accordance with examples as disclosed herein. As shown in FIG. 4C, a storage element material 465 may be formed in the plurality of recesses 315 by conformally depositing the storage element material 465 into the trench 350. The storage element material 465 may be deposited to contact sidewalls 390 and 391 and a bottom wall 395 of the trench 350 exposed by the etching of the conformal material 320. When the storage element material 465 contacts the bottom wall 395 of the trench 350, the storage element material 465 covers the exposed contacts 235.

The dimensions of the storage element material 465 may be based on the dimensions of other components of the memory array 200-i. For example, a height of the storage element material 465 may be controlled by depositing thicker or thinner layers of material 245 and/or the insulative material 240. In another example, a depth of the storage element material 465 may be controlled by etching longer or shorter recesses (e.g., recesses 315 as described with reference to FIG. 4B). By controlling the dimensions of other components of the memory array 200-i, the dimensions of the storage element material 465 may be controlled according to the desired dimensions of a memory cell associated with the memory array 200-i.

The storage element material 465 may be an example of a chalcogenide material, such as a chalcogenide alloy and/or glass, that may serve as a self-selecting storage element material (e.g., a material that may serve as both a select device and a storage element). For example, the storage element material 465 may be responsive to an applied voltage, such as a program pulse. For an applied voltage that is less than a threshold voltage, the storage element material 465 may remain in an electrically nonconductive state (e.g., an "off" state). Alternatively, responsive to an applied voltage that is greater than the threshold voltage, the storage element material 465 may enter an electrically conductive state (e.g., an "on" state).

FIG. 4D illustrates a cross-sectional view of an example memory array 200-j in accordance with examples as disclosed herein. An etching operation may be performed subsequent to forming the storage element material 465 so that surfaces of the storage element material 465 (e.g., the surfaces facing into the trench 350) is approximately coplanar with surfaces of the second insulative material 240 (e.g., the surfaces facing into the trench 350) as illustrated in FIG. 4D. The etching of the storage element material 465 may form a continuous sidewall and remove the top layer 466 (shown in FIG. 4C) of the storage element material 465, whereby cells of the storage element material 465 are formed in the recesses. In each recess, each cell of the storage element material 465 may contact a single material 245 (e.g., a single material 245 located adjacent to the cell of the storage element material 465) and at least two dielectric layers (e.g. a top dielectric layer and a bottom dielectric layer located on top of the cell of the storage element material 465 and on bottom of the cell of the storage element material 465), as shown in FIG. 4D. The etching of the storage element material 465 may provide a configuration in which the storage element material 465 are separated from one another. The etching of the storage element material 465 may also expose the contacts 235 in the substrate 104. In some examples, portion of sacrificial material may be located on either side of the cell of the storage element material 465 (as shown in FIG. 4E).

FIG. 4E illustrates a top view of an example memory array 200-*j* in accordance with examples as disclosed herein. As illustrated in FIG. 4E, the conformal material 320 and the storage element material 465 formed in the trench 350 may bifurcate each plane of the material 245 into a first portion 308 and a second portion 309. Each portion of a plane may be an example of a word line plate.

FIG. 4F illustrates a top view of an example memory array 200-*k* in accordance with examples as disclosed herein. As shown in FIG. 4F, a barrier material 470 is deposited into openings 360. In some implementations, the barrier material 470 contacts at least one portion of the first insulative material 240, the second insulative material 240, and the storage element material 465 as shown in FIG. 4D. In some examples, the barrier material 470 is compatible with an active material. The barrier material 470 may be a conductive material (e.g., a conformal conducive material), or a barrier layer with a conductive material. For example, the barrier material 470 may comprise aluminum oxide. In some examples, an etching operation may be performed to make room for conductive material to be deposited into the trench 350. In some cases, the barrier material 470 may be referred to as a barrier layer.

A material 475 may be deposited in the opening 360 to form a conductive pillar. Although FIG. 4F illustrates the material 475 as a dielectric material, the material 475 may be metallic (or semi-metallic) material or a semiconductor material such as a doped polysilicon material, among others. However, other metallic, semi-metallic, or semiconductor materials may be used. a metal material or a dielectric material. In some cases, the pillar may be partially filled by a metallic material and subsequently filled by a dielectric material. In some cases, the barrier material 470 may be a same material as the material 475. For example, the barrier material 470 and the material 475 may correspond to a conductive pillar including a uniform conductive material.

The conductive pillar may include the barrier material 470 and the material 475. In some examples, the conductive pillar may be formed in contact with the storage element material 465 on the sidewalls 390 and 391 (shown in FIG. 4C) of the trench 350. The conductive pillar may be a cylinder. Although FIG. 4F illustrates the conductive pillar as a solid pillar, in some examples the conductive pillar may be a hollow cylinder or toroidal (e.g., a tube).

The conductive pillar formed in each respective one of the plurality of openings 360 are arranged to extend substantially orthogonal to the alternating planes of the material 245 and the second insulative material 240 as shown in FIG. 4D. The storage element material 465 and the conductive pillar formed in each respective one of the plurality of openings 360 are formed in a substantially square shape. Examples of the present disclosure are not limited to exact or quasi-exact square shapes. For instance, the storage element material 465 and the conductive pillar may be formed in any shape, including circles or oval shapes, for instance.

FIG. 4G illustrates a top view of an example memory array 200-1 in accordance with examples as disclosed herein. A plurality of second openings 490 in a trench 350 may be formed by etching away a portion of the material 475, the barrier material 470, and the storage element material 465.

The etching process may expose one or more surfaces of the material 245 (e.g., corresponding to word line plates) and the insulative material 240. An example view showing the details about the relationships between the material 245 and insulative material 240 after the etching process is shown and described with reference to FIG. 4B. In some cases, the etching process may expose portions of the recesses that were filled with the storage element material 465. The etching process may include a vertical etching process that occurs substantially orthogonally to the alternating planes of the material 245 and the second insulative material 240 as shown in FIG. 4D. The etching process may include a first dry etching process that etches a first portion of the material 475 (e.g., a portion of the material 475 including a dielectric material). The etching process may subsequently include a selective wet etching process that etches a second portion of the material 475 (e.g., a portion of the material 475 including a conformal metallic material). The etching process may further include a selective etching process of the storage element material 465 inside each of the plurality of recesses.

The etching process may divide the conductive pillar into a pair of pillars 485. In some examples, each pillar 485 of the pair of pillars may be a digit line. The etching process may divide each storage element material 465 into a pair of storage element component 480. As a result, each recess may include a first storage element component 480 coupled with a first pillar 485 and a second storage element component 480 coupled with a second pillar 485. Each storage element 480 may be coupled to a pillar 485 (e.g., of a pair of pillars 485) and an even or odd access line (e.g., portion 308 may be a first access line and the second portion 309 may be a second access line). Therefore, each storage element 480 may be individually addressed (e.g., by applying a voltage to an access line and a pillar 485). The storage element components 480 may enable the memory array 200-1 (and memory arrays 200 formed by processing steps subsequent to memory array 200-1) to store data. That is, the storage element component 480 may include the storage element material 465 and may be configured to store a logic state (e.g., a logic value '0' or logic value '1').

The storage element component 480 may be programmed to a target state by applying a pulse (e.g., a programming pulse) that satisfies a programming threshold. The amplitude, shape, or other characteristics of the programming pulse may be configured to cause the storage element material 465 to exhibit the target state. For example, after applying the programming pulse, the ions of the storage element component 480 may be redistributed throughout the storage element, thereby altering a resistance of the memory cell detected when a read pulse is applied. In some cases, the threshold voltage of the storage element component 480 may vary based on applying the programming pulse.

The state stored by the storage element component 480 may be sensed, detected, or read by applying read pulse to the storage element component 480. The amplitude, shape, or other characteristics of the read pulse may be configured to allow a sense component to determine what state is stored on the storage element component 480. For example, in some cases, the amplitude of the read pulse is configured to be at a level that the storage element component 480 will be in an "on" state (e.g., current is conducted through the material) for a first state but will be in an "off" state (e.g., little to no current is conducted through the material) for a second state.

In some cases, the polarity of the pulse (whether programming or read) applied to the storage element component 480 may affect the outcomes of the operation being performed. For example, if the storage element component 480 stores a first state, a read pulse of a first polarity may result in the storage element component 480 exhibiting an "on" state while a read pulse of a second polarity may result in the storage element component 480 exhibiting an "off" state. This may occur because of the asymmetrical distributions of ions or other material in the storage element component 480 when it is storing a state. Similar principles apply to programming pulses and other pulses or voltages.

Examples of chalcogenide materials that may serve as the storage element component 480 include indium (In)-antimony (Sb)-tellurium (Te) (IST) materials, such as $In_2Sb_2Te_5$, $In_1Sb_2Te_4$, $In_1Sb_4Te_7$, etc., and germanium (Ge)-antimony (Sb)-tellurium (Te) (GST) materials, such as $Ge_8Sb_5Te_8$, $Ge_2Sb_2Te_5$, $Ge_1Sb_2Te_4$, $Ge_1Sb_4Te_7$, $Ge_4Sb_4Te_7$, or etc., among other chalcogenide materials, including, for instance, alloys that do not change phase during the operation (e.g., selenium-based chalcogenide alloys). Further, the chalcogenide material may include minor concentrations of other dopant materials. Other examples of chalcogenide materials may include tellurium-arsenic (As)-germanium (OTS) materials, Ge, Sb, Te, silicon (Si), nickel (Ni), gallium (Ga), As, silver (Ag), tin (Sn), gold (Au), lead (Pb), bismuth (Bi), indium (In), selenium (Se), oxygen (O), Sulphur (S), nitrogen (N), carbon (C), yttrium (Y), and scandium (Sc) materials, and combinations thereof. The hyphenated chemical composition notation, as used herein, indicates the elements included in a particular mixture or compound, and is intended to represent all stoichiometries involving the indicated elements. In some examples, the chalcogenide material may be a chalcogenide glass or amorphous chalcogenide material. In some example, a chalcogenide material having primarily selenium (Se), arsenic (As), and germanium (Ge) may be referred to as SAG-alloy. In some examples, SAG-alloy may include silicon (Si) and such chalcogenide material may be referred to as SiSAG-alloy. In some examples, the chalcogenide glass may include additional elements such as hydrogen (H), oxygen (O), nitrogen (N), chlorine (Cl), or fluorine (F), each in atomic or molecular forms. In some examples, conductivity may be controlled through doping using various chemical species. For example, doping may include incorporating a Group 3 (e.g., boron (B), gallium (Ga), indium (In), aluminum (Al), etc.) or Group 4 (tin (Sn), carbon (C), silicon (Si), etc.) element into the composition.

Figure 5A:
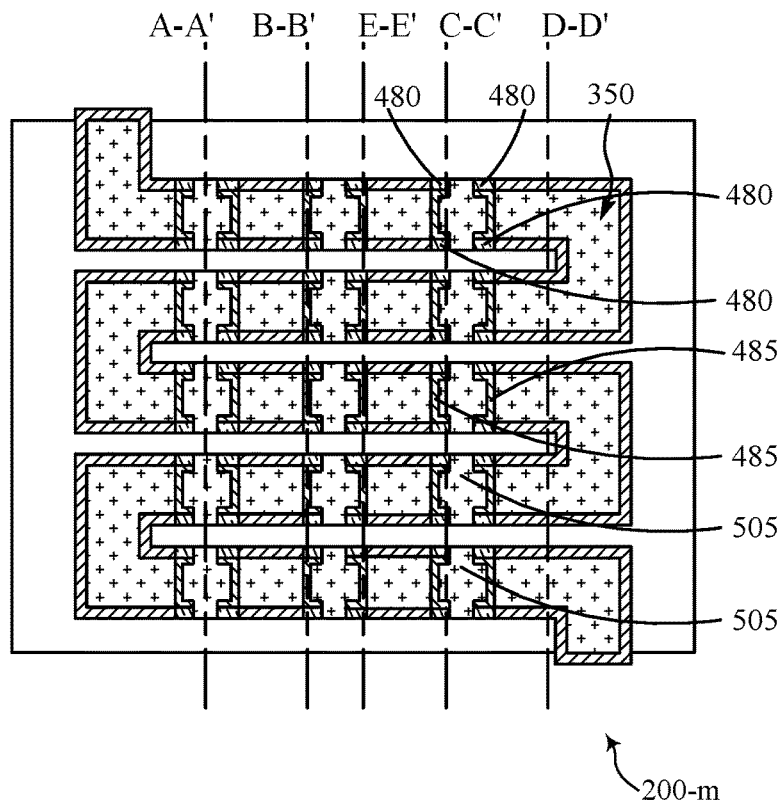
FIGS. 5A through 5E illustrate various views of example memory arrays that support a memory device with a split pillar architecture in accordance with examples as disclosed herein.

FIGS. 5A-5E illustrate various views of memory array 200-*m*. Specifically, FIGS. 5A through 5E illustrate views of the memory array 200-*m* formed after forming the second openings 490 in the memory array 200-1 as described with reference to FIG. 4G and after depositing insulative material 505 into the second openings 490. FIG. 5A illustrates a top view of a memory array 200-*m*, which may be an example of the memory array 200-1 illustrated in FIG. 4G after formation of the second openings 490. FIGS. 5B through 5E may be cross-sectional views of the memory array 200-*m* taken along different section lines during a processing step that is subsequent to what is illustrated in FIG. 5A.

FIG. 5A illustrates a top view of a memory array 200-*m* in accordance with examples as disclosed herein. Memory array 200-*m* may be formed after depositing an insulative material 505 into the openings 490 shown in FIG. 4G. The insulative material 505 may be a dielectric material. The insulative material 505 may contact the pillars 485 and the storage element components 480. The insulative material 505 may isolate pillars 485 within a pillar pair from each other. For example, there may be multiple pillars along section line B-B' and corresponding pillar pairs along section line E-E'. The insulative material 505 (e.g., along portions of section line A-A') may isolate the pillars along section line B-B' from the pillars along section line E-E'. This may decrease an effect of accessing a first storage element component 480 on a second storage element component 480 if the first and second storage element components 480 are positioned in a same recess (e.g., formed from the same storage element material 465).

Memory array 200-*m* may further include a second substrate 104 formed above the first substrate 104 (shown in FIGS. 2A through 2C). In some cases, the second substrate 104 may include a plurality of conductive contacts (e.g., contacts 235) formed in the substrate 104 and extending through the substrate 104. Each pillar 485 may be in contact with a contact (e.g., of the first substrate 104 or the second substrate 104).

Figure 5B:
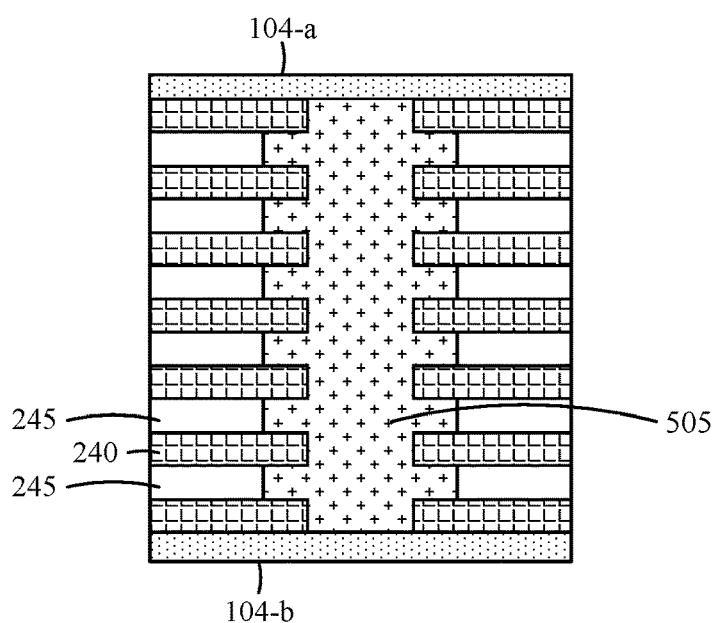

FIG. 5B illustrates a cross-sectional view of memory array 200-*m* along section line A-A' of FIG. 5A. As illustrated in FIG. 5B, memory array 200-*m* may include several alternating layers of a material 245 and an insulative material 240. The layers may be positioned between a first and second substrate 104. The insulative material 505 may isolate the pillars within a pair of pillars. The insulative material 505 may extend to contact each pillar 485 of a pair of pillars as shown in FIG. 5A.

Figure 5E:
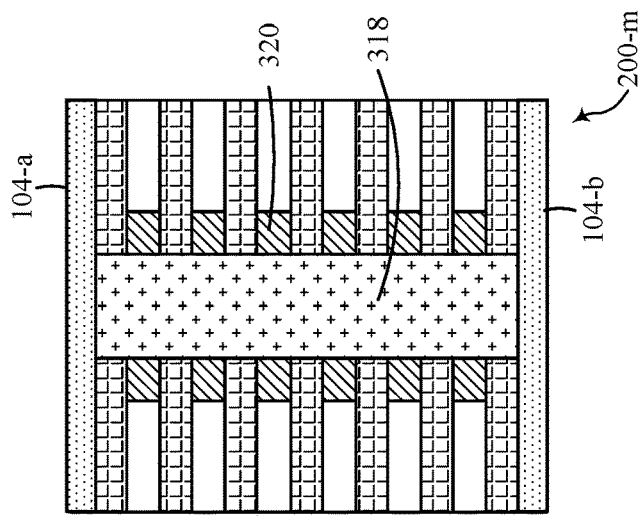
Figure 5D:
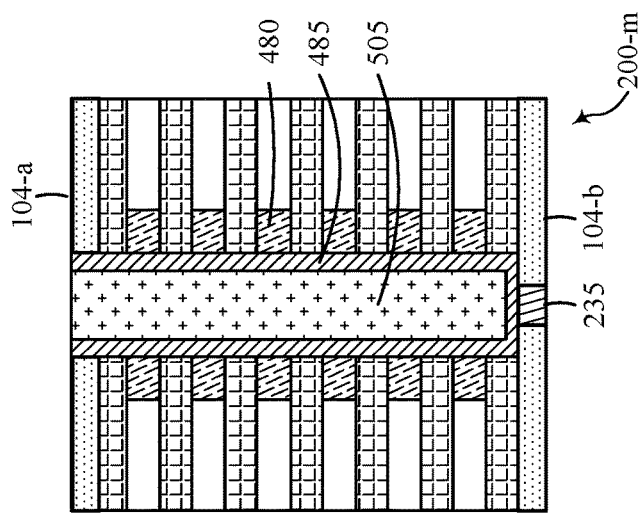
Figure 5C:
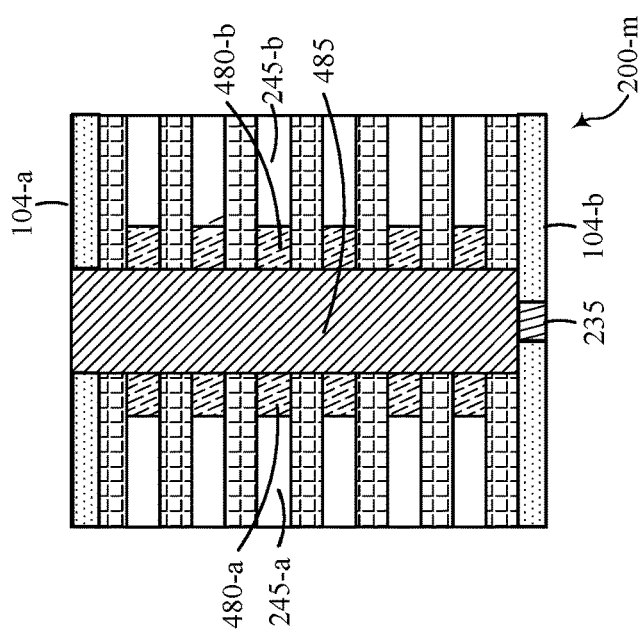

FIG. 5C illustrates a cross-sectional view of memory array 200-*m* along section line B-B' of FIG. 5A. The pillar 485 is in contact with contact 235 associated with the substrate 104-*b* positioned below the pillar 485. In some cases, the contact 235 may be associated with the substrate 104-*a* positioned above the pillar 485. The pillar 485 may be in contact with storage element components 480 positioned in opposite recesses. For example, the pillar 485 may be in contact with storage element component 480-*a* and 480-*b*. The material 245-*a* and 245-*b* may be isolated from each other. For example, material 245-*a* may be associated with an odd word line plate and material 245-*b* may be associated with an even word line plate. In some cases, material 245-*a* may be a conductive material associated with a word line plate. Additionally or alternatively, material 245-*a* may be a sacrificial insulative material. Here, the material 245-*a* may subsequently (e.g., during a process step subsequent to what is illustrated in FIG. 5C) be removed and replaced by a conducive material for a word line plate.

FIG. 5D illustrates a cross-sectional view of memory array 200-*m* along section line C-C' of FIG. 5A. FIG. 5D may illustrate a pillar 485 in contact with the insulative material 505. The pillar 485 may be in contact with a plurality of storage element components 480 and a contact associated with the substrate 104-*b* positioned below the pillar 485.

FIG. 5E illustrates a cross-sectional view of memory array 200-*m* along section line D-D' of FIG. 5A. FIG. 5E may illustrate conformal material 320 and dielectric material 318. The conformal material 320 may extend to contact two storage element components 480 on a same deck and in contact with the same word line plate. The conformal material 320 may isolate the storage element components 480 from each other. The dielectric material 318 may extend to contact two pillars. The first pillar may be associated with a first pair of pillars and the second pillar may be associated with a second pair of pillars.

Figure 6A:
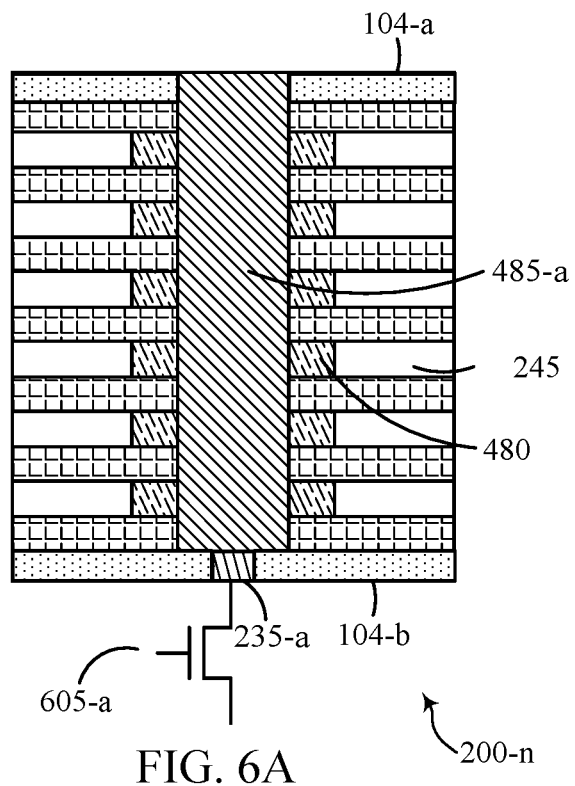
FIGS. 6A and 6B illustrate various views of example memory arrays that support a memory device with a split pillar architecture in accordance with examples as disclosed herein.
Figure 6B:
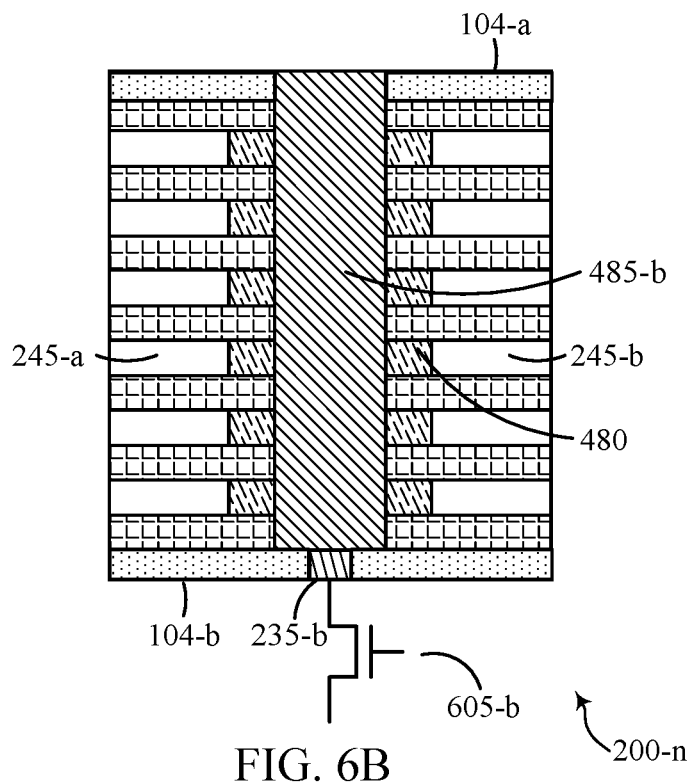

FIGS. 6A and 6B illustrate examples of memory array 200-*n* that supports a memory device with a split pillar architecture in accordance with examples as disclosed herein. FIGS. 6A and 6B illustrate a configuration of a memory device where each pillar 485 in a pair of pillars contacts a contact 235 on a same substrate 104. The substrate 104-*b* of memory array 200-*n* may correspond to the memory array 200-*a* illustrated in FIG. 2A. In some other cases, the substrate 104-*b* may be positioned above each pillar 485. Here, the top view of the memory array 200-*n* may correspond to the memory array 200-*a* illustrated in FIG. 2A.

FIG. 6A illustrates a cross-sectional view of memory array 200-*n* along section line B-B' as shown in FIG. 5A. Memory array 200-*n* may include pillar 485-*a* in contact with contact 235-*a* of substrate 104-*b*. The contact 235-*a* may couple the pillar 485-*a* to transistor 605-*a*. The transistor 605-*a* may be an example of a digit line selector formed in a regular matrix. Activating the transistor 605-*a* may initiate an access operation (e.g., a read operation, a write operation, a refresh operation) of one of the storage element components 480. For example, activating transistor 605-*a* and applying a voltage to material 245 (e.g., by a word line driver) may access storage element component 480. That is, each of the storage element components 480 may be individually addressed by activating a transistor 605 and applying a voltage to material 245. The material 245 may be a conductive material. In some cases, the material 245 may have been deposited onto a stack (e.g., during a process step illustrated prior to FIG. 2C) as a conductive material. In some other cases, the material 245 may have been deposited onto the stack as a sacrificial insulative material. In a subsequent process step, the material 245 may have been removed and replaced with a conductive material.

FIG. 6B illustrates a cross-sectional view of memory array 200-*n* along section line E-E' as shown in FIG. 5A. Memory array 200-*n* may include pillar 485-*b* in contact with contact 235-*b* of substrate 104-*b*. The pillar 485-*b* and the pillar 485-*a* (e.g., shown in FIG. 6A) may be a pair of pillars. That is, pillars 485-*a* and 485-*b* may be formed when a conductive pillar was divided by an etching process. The contact 235-*b* may couple the pillar 485-*b* to transistor 605-*b*, which may be an example of a digit line selector formed in a regular matrix. In some cases, the transistor 605-*b* may be at a same level (e.g., part of a same matrix) as the transistor 605-*a*. In some other cases, the transistor 605-*b* may be offset from the transistor 605-*a*. For example, the transistor 605-*b* may be positioned below the transistor 605-*a*.

Figure 7A:
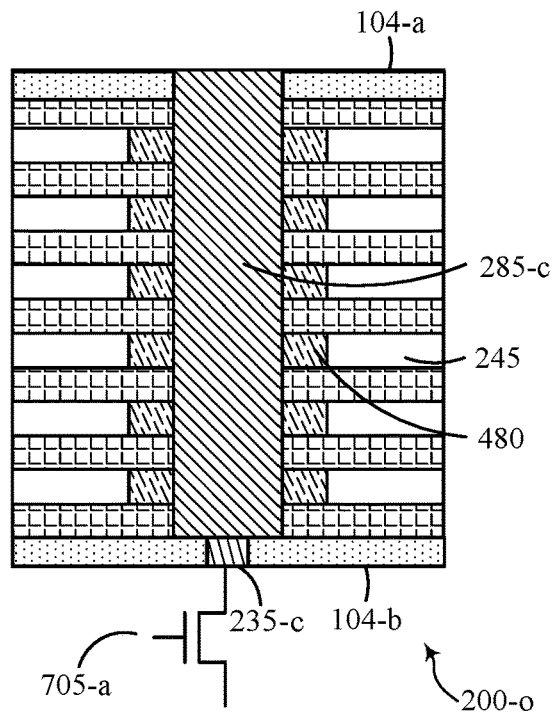
FIGS. 7A and 7B illustrate various views of example memory arrays that support a memory device with a split pillar architecture in accordance with examples as disclosed herein.
Figure 7B:
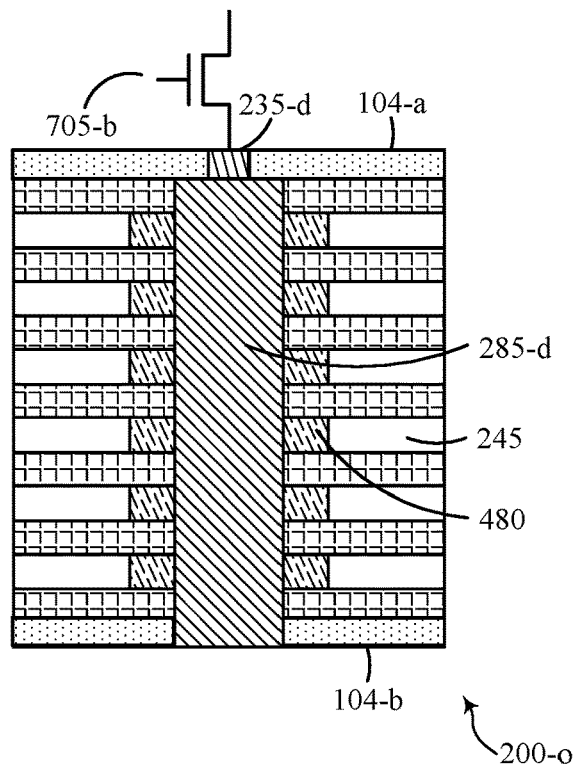

FIGS. 7A and 7B illustrate examples of memory array 200-*o* that supports a memory device with a split pillar architecture in accordance with examples as disclosed herein. FIGS. 7A and 7B illustrate a configuration of a memory device where one pillar 485 contacts a contact 235 on a substrate 104 positioned below the pillar 485 and the second pillar 485 contacts a contact 235 on a substrate 104 positioned above the pillar 485. The substrates 104-*b* and 104-*a* of the memory array 200-*o* may correspond to memory array 200-*b* illustrated in FIG. 2B.

FIG. 7A illustrates a cross-sectional view of memory array 200-*o* along section line B-B' as shown in FIG. 5A. Memory array 200-*o* may include a pillar 485-*c* in contact with contact 235-*c* of substrate 104-*b*. The contact 235-*c* may couple the pillar 485-*c* to transistor 705-*a*. The transistor 705-*a* may be an example of a digit line selector formed in a regular matrix. Activating the transistor 705-*a* may initiate an access operation (e.g., a read operation, a write operation, a refresh operation) of one of the storage element components 480. For example, activating transistor 705-*a* and applying a voltage to material 245 (e.g., by a word line driver) may access storage element component 480. The material 245 may be a conductive material. In some cases, the material 245 may have been deposited onto a stack (e.g., during a process step illustrated prior to FIG. 2C) as a conductive material. In some other cases, the material 245 may have been deposited onto the stack as a sacrificial insulative material. In a subsequent process step, the material 245 may have been removed and replaced with a conductive material.

FIG. 7B illustrates a cross-sectional view of memory array 200-*o* along section line E-E' as shown in FIG. 5A. Memory array 200-*o* may include a pillar 485-*d* in contact with contact 235-*d* of substrate 104-*a*. the pillar 485-*d* and the pillar 485-*c* (e.g., shown in FIG. 6A) may be a pair of pillars. That is, pillars 485-*c* and 485-*d* may be formed when a conductive pillar was divided by an etching process. The contact 235-*d* may couple the pillar 485-*d* to transistor 705-*b*, which may be an example of a digit line selector formed in a regular matrix.

Figure 8:
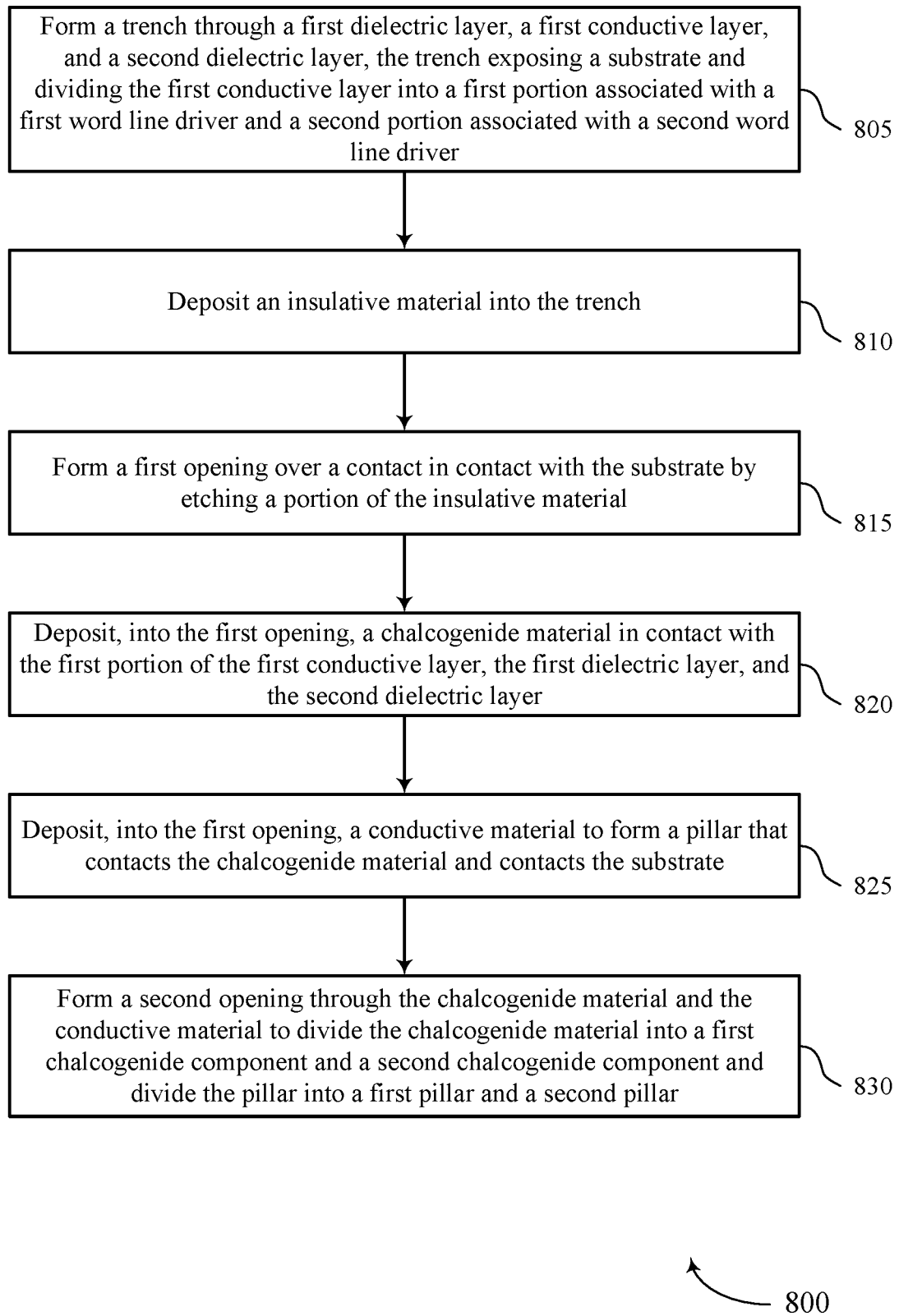
FIGS. 8 through 11 show flowcharts illustrating a method or methods that support a memory device with a split pillar architecture in accordance with examples as disclosed herein.

FIG. 8 shows a flowchart illustrating a method or methods 800 that supports a memory device with a split pillar architecture in accordance with examples as disclosed herein. The operations of method 800 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 805, the method 800 may include forming a trench through a first dielectric layer, a first conductive layer, and a second dielectric layer, the trench exposing a substrate and dividing the first conductive layer into a first portion associated with a first word line driver and a second portion associated with a second word line driver. The operations of 805 may be performed according to the methods described herein.

At 810, the method 800 may include depositing an insulative material into the trench. The operations of 810 may be performed according to the methods described herein.

At 815, the method 800 may include forming a first opening over a contact in contact with the substrate by etching a portion of the insulative material. The operations of 815 may be performed according to the methods described herein.

At 820, the method 800 may include depositing, into the first opening, a chalcogenide material in contact with the first portion of the first conductive layer, the first dielectric layer, and the second dielectric layer. The operations of 820 may be performed according to the methods described herein.

At 825, the method 800 may include depositing, into the first opening, a conductive material to form a pillar that contacts the chalcogenide material and contacts the substrate. The operations of 825 may be performed according to the methods described herein.

At 830, the method 800 may include forming a second opening through the chalcogenide material and the conductive material to divide the chalcogenide material into a first chalcogenide component and a second chalcogenide component and divide the pillar into a first pillar and a second pillar. The operations of 830 may be performed according to the methods described herein.

In some examples, an apparatus as described herein may perform a method or methods, such as the method 800. The apparatus may include features, means, or instructions (e.g., a non-transitory computer-readable medium storing instructions executable by a processor) for forming a trench through a first dielectric layer, a first conductive layer, and a second dielectric layer, the trench exposing a substrate and dividing the first conductive layer into a first portion associated with a first word line driver and a second portion associated with a second word line driver. The apparatus may further include features, means, or instructions for depositing an insulative material into the trench, forming a first opening over a contact in contact with the substrate by etching a portion of the insulative material, depositing, into the first opening, a chalcogenide material in contact with the first portion of the first conductive layer, the first dielectric layer, and the second dielectric layer, depositing, into the first opening, a conductive material to form a pillar that contacts the chalcogenide material and contacts the substrate, and forming a second opening through the chalcogenide material and the conductive material to divide the chalcogenide material into a first chalcogenide component and a second chalcogenide component and divide the pillar into a first pillar and a second pillar.

Some examples of the method 800 and the apparatus described herein may further include operations, features, means, or instructions for depositing, into the second opening, a second insulative material that contacts the first chalcogenide component and the second chalcogenide component. Some instances of the method 800 and the apparatus described herein may further include operations, features, means, or instructions for depositing a conformal material that contacts a first sidewall and a second sidewall of the trench, where depositing the insulative material into the trench may be based on depositing the conformal material.

In some cases of the method 800 and the apparatus described herein, the first chalcogenide component includes a first wall contacting the first conductive layer, a second wall contacting a second insulative material, a third wall contacting the first pillar, and a fourth wall contacting a conformal material. In some examples of the method 800 and the apparatus described herein, forming the second opening through the chalcogenide material and the conductive material may include operations, features, means, or instructions for performing a dry etching process to etch a second insulative material, performing a selective wet etching process to divide the conductive material into the first pillar and the second pillar, and performing a selective etching process to divide the chalcogenide material into the first chalcogenide component and the second chalcogenide component.

In some instances of the method 800 and the apparatus described herein, the first pillar may be formed over the contact extending through the substrate, and the second pillar may be formed over a second contact extending through the substrate. Some cases of the method 800 and the apparatus described herein may further include operations, features, means, or instructions for depositing a second substrate over the first dielectric layer, the second substrate in contact with the first pillar and the second pillar, where the second substrate includes a second contact extending through the second substrate and in contact with the first pillar, where the second pillar may be in contact with the contact of the substrate.

Some examples of the method 800 and the apparatus described herein may further include operations, features, means, or instructions for forming a set of contacts extending through the substrate, the set of contacts may be associated with a set of digit lines, forming the first dielectric layer on the substrate, forming the first conductive layer on the first dielectric layer, the first conductive layer configured as at least one word line plate, and forming the second dielectric layer on the first conductive layer, where forming the trench may be based on forming the second dielectric layer. In some instances of the method 800 and the apparatus described herein, the first pillar contacts at least one portion of the first dielectric layer, the second dielectric layer, and the first chalcogenide component, and the second pillar contacts at least one portion of the first dielectric layer, the second dielectric layer, and the second chalcogenide component.

In some cases of the method 800 and the apparatus described herein, the first pillar and the second pillar may be configured as digit lines. In some examples of the method 800 and the apparatus described herein, forming the trench through the first dielectric layer may include operations, features, means, or instructions for performing a vertical etching process to vertically etch the trench, and performing a horizontal etching process after the vertical etching process to form at least one recess in the first conductive layer.

In some instances of the method 800 and the apparatus described herein, the trench extends through the first conductive layer in a serpentine shape. In some cases of the method 800 and the apparatus described herein, the first chalcogenide component and the second chalcogenide component each include a storage element for a self-selecting memory cell.

Figure 9:
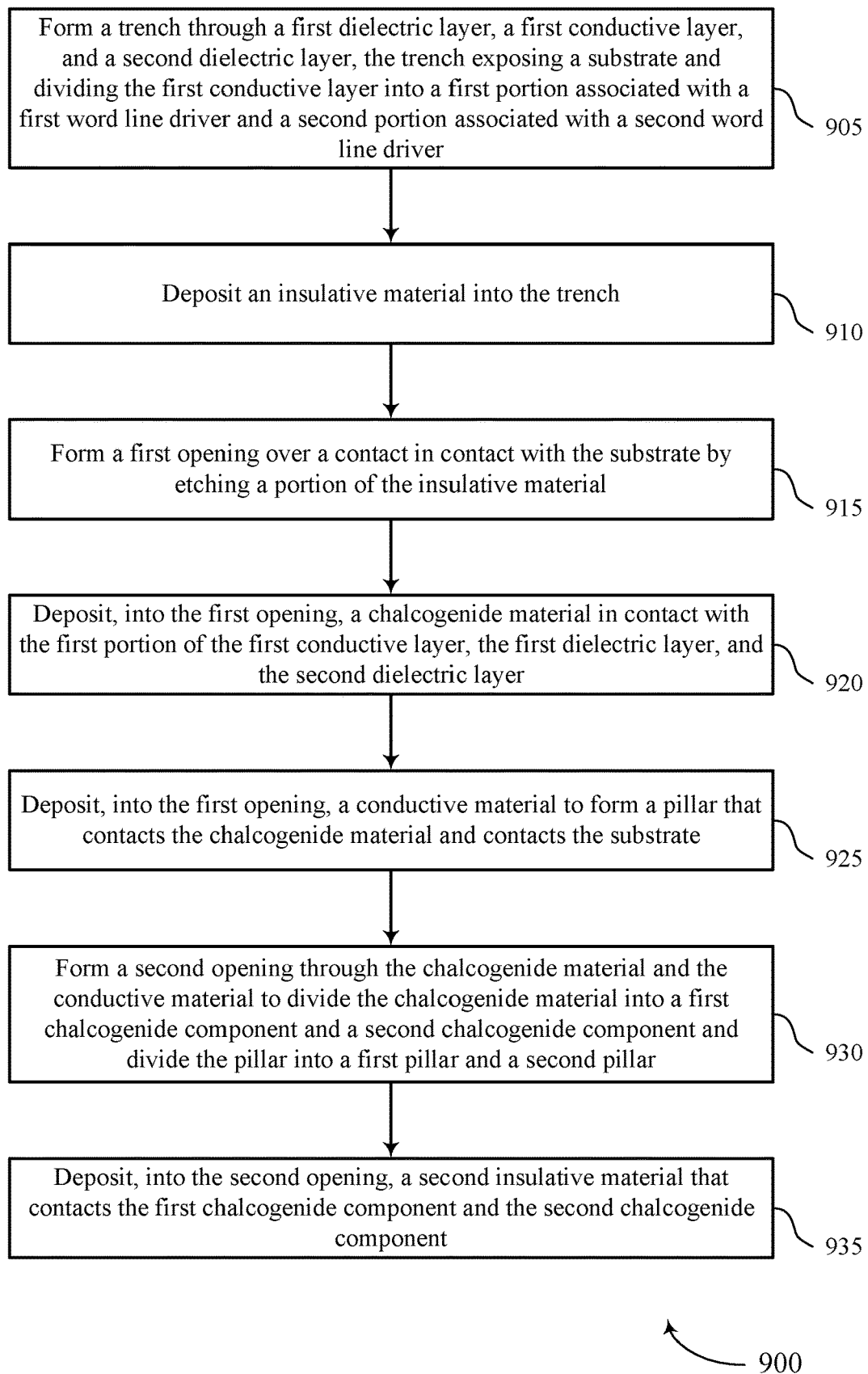

FIG. 9 shows a flowchart illustrating a method or methods 900 that supports a memory device with a split pillar architecture in accordance with examples as disclosed herein. The operations of method 900 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 905, the method 900 may include forming a trench through a first dielectric layer, a first conductive layer, and a second dielectric layer, the trench exposing a substrate and dividing the first conductive layer into a first portion associated with a first word line driver and a second portion associated with a second word line driver. The operations of 905 may be performed according to the methods described herein.

At 910, the method 900 may include depositing an insulative material into the trench. The operations of 910 may be performed according to the methods described herein.

At 915, the method 900 may include forming a first opening over a contact in contact with the substrate by etching a portion of the insulative material.

At 920, the method 900 may include depositing, into the first opening, a chalcogenide material in contact with the first portion of the first conductive layer, the first dielectric layer, and the second dielectric layer. The operations of 920 may be performed according to the methods described herein.

At 925, the method 900 may include depositing, into the first opening, a conductive material to form a pillar that contacts the chalcogenide material and contacts the substrate. The operations of 925 may be performed according to the methods described herein.

At 930, the method 900 may include forming a second opening through the chalcogenide material and the conductive material to divide the chalcogenide material into a first chalcogenide component and a second chalcogenide component and divide the pillar into a first pillar and a second pillar. The operations of 930 may be performed according to the methods described herein.

At 935, the method 900 may include depositing, into the second opening, a second insulative material that contacts the first chalcogenide component and the second chalcogenide component. The operations of 935 may be performed according to the methods described herein.

Figure 10:
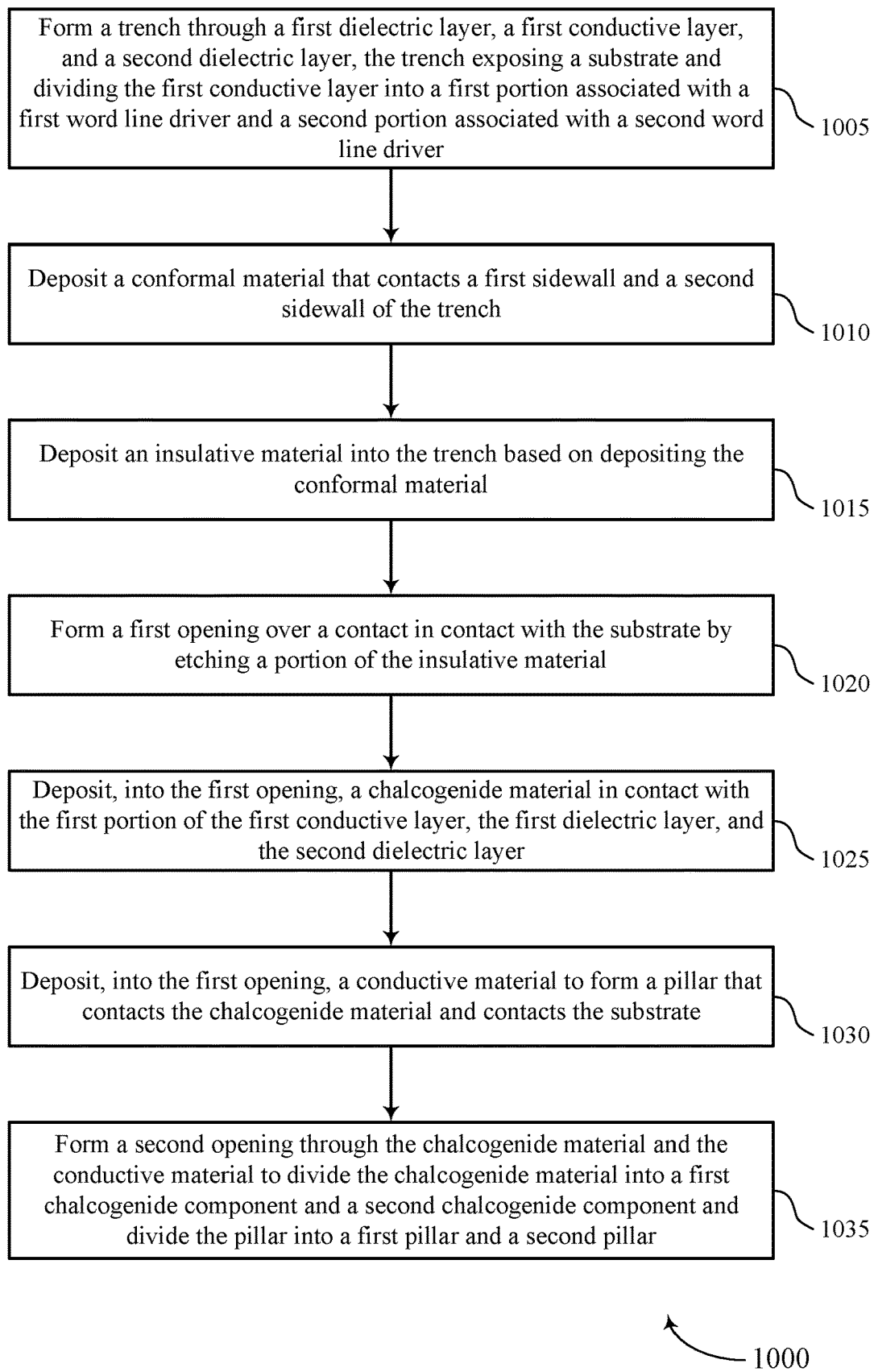

FIG. 10 shows a flowchart illustrating a method or methods 1000 that supports a memory device with a split pillar architecture in accordance with examples as disclosed herein. The operations of method 1000 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 1005, the method 1000 may include forming a trench through a first dielectric layer, a first conductive layer, and a second dielectric layer, the trench exposing a substrate and dividing the first conductive layer into a first portion associated with a first word line driver and a second portion associated with a second word line driver. The operations of 1005 may be performed according to the methods described herein.

At 1010, the method 1000 may include depositing a conformal material that contacts a first sidewall and a second sidewall of the trench. The operations of 1010 may be performed according to the methods described herein.

At 1015, the method 1000 may include depositing an insulative material into the trench based on depositing the conformal material. The operations of 1015 may be performed according to the methods described herein.

At 1020, the method 1000 may include forming a first opening over a contact in contact with the substrate by etching a portion of the insulative material. The operations of 1020 may be performed according to the methods described herein.

At 1025, the method 1000 may include depositing, into the first opening, a chalcogenide material in contact with the first portion of the first conductive layer, the first dielectric layer, and the second dielectric layer. The operations of 1025 may be performed according to the methods described herein.

At 1030, the method 1000 may include depositing, into the first opening, a conductive material to form a pillar that contacts the chalcogenide material and contacts the substrate. The operations of 1030 may be performed according to the methods described herein.

At 1035, the method 1000 may include forming a second opening through the chalcogenide material and the conductive material to divide the chalcogenide material into a first chalcogenide component and a second chalcogenide component and divide the pillar into a first pillar and a second pillar. The operations of 1035 may be performed according to the methods described herein.

Figure 11:
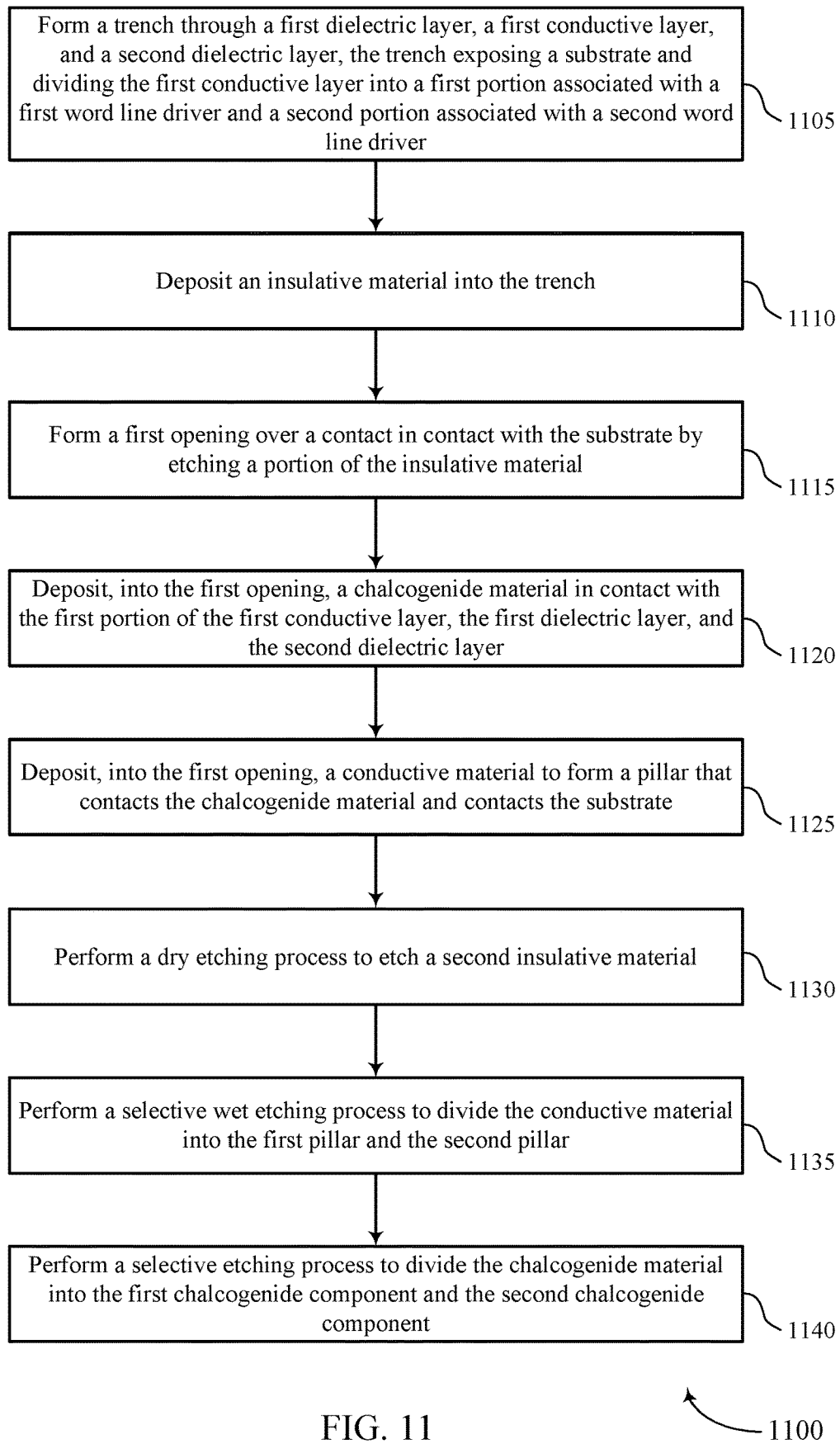

FIG. 11 shows a flowchart illustrating a method or methods 1100 that supports a memory device with a split pillar architecture in accordance with examples as disclosed herein. The operations of method 1100 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 1105, the method 1100 may include forming a trench through a first dielectric layer, a first conductive layer, and a second dielectric layer, the trench exposing a substrate and dividing the first conductive layer into a first portion associated with a first word line driver and a second portion associated with a second word line driver. The operations of 1105 may be performed according to the methods described herein.

At 1110, the method 1100 may include depositing an insulative material into the trench. The operations of 1110 may be performed according to the methods described herein.

At 1115, the method 1100 may include forming a first opening over a contact in contact with the substrate by etching a portion of the insulative material. The operations of 1115 may be performed according to the methods described herein.

At 1120, the method 1100 may include depositing, into the first opening, a chalcogenide material in contact with the first portion of the first conductive layer, the first dielectric layer, and the second dielectric layer. The operations of 1120 may be performed according to the methods described herein.

At 1125, the method 1100 may include depositing, into the first opening, a conductive material to form a pillar that contacts the chalcogenide material and contacts the substrate. The operations of 1125 may be performed according to the methods described herein.

At 1130, the method 1100 may include performing a dry etching process to etch a second insulative material. The operations of 1130 may be performed according to the methods described herein.

At 1135, the method 1100 may include performing a selective wet etching process to divide the conductive material into the first pillar and the second pillar. The operations of 1135 may be performed according to the methods described herein.

At 1140, the method 1100 may include performing a selective etching process to divide the chalcogenide material into the first chalcogenide component and the second chalcogenide component. The operations of 1140 may be performed according to the methods described herein.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a set of contacts associated with a set of digit lines and extending through a substrate, a first set of word line plates separated from a second set of word line plates by a trench, and a pair of pillars configured as digit lines and each configured to interact with the first set of word line plates and the second set of word line plates. The apparatus may further include a dielectric material positioned between a first pillar of the pair of pillars and a second pillar of the pair of pillars, and a set of storage elements including chalcogenide material and in contact with the dielectric material, a word line plate of the first set or the second set of word line plates, and a pillar of the pair of pillars.

Some examples of the apparatus may include a second pair of pillars configured as digit lines and each configured to interact with both the first set of word line plates and the second set of word line plates, where a first distance between each pillar of the pair of pillars may be less than a second distance between the pair of pillars and the second pair of pillars.

Some cases of the apparatus may include a second dielectric material positioned between the first pillar of the pair of pillars and a third pillar of the second pair of pillars. In some instances, a first pair of storage elements may be in contact with the first pillar of the pair of pillars, and a second pair of storage elements may be in contact with the second pillar of the pair of pillars.

Some examples of the apparatus may include a conformal material contacting at least one word line plate and extending between a first storage element of the first pair of storage elements and a second storage element of the second pair of storage elements. In some instances, the set of storage elements may be positioned in recesses formed by the at least one word line plate and the at least one pillar of the pair of pillars. In some cases, the trench extends in a serpentine shape over the substrate. Some examples of the apparatus may include a second set of contacts associated with a second set of digit lines and extending through a second substrate, where the first pillar of the pair of pillars may be in contact with one of the set of contacts and the second pillar of the pair of pillars may be in contact with one of the second set of contacts.

An apparatus is described. The apparatus may include a first word line plate in a first layer of a memory device and a second word line plate in the first layer of the memory device, the second word line plate separated from the first word line plate. The apparatus may further include a first digit line extending from the first layer to at least a second layer of the memory device and a second digit line separated from the first digit line and extending from the first layer to at least the second layer. The apparatus may further include a first storage element in contact with the first word line plate and the first digit line, a second storage element in contact with the first word line plate and the second digit line, a third storage element in contact with the second word line plate and the first digit line, and a fourth storage element in contact with the second word line plate and the second digit line.

Some examples of the apparatus may include a dielectric material in contact with the first word line plate, the second word line plate, the first digit line, and the second digit line. In some cases, the dielectric material may be in contact with the first storage element, the second storage element, the third storage element, and the fourth storage element. Some instances of the apparatus may include a dielectric layer between the first layer and the second layer. The second layer may include a sixth storage element in contact with the third word line plate and the second digit line, a seventh storage element in contact with a fourth word line plate in the second layer and the first digit line, and an eighth storage element in contact with the fourth word line plate and the second digit line.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers.

In some of the appended figures, two dimensions of a three-dimensional layer are depicted for purposes of illustration.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   forming a trench through a first dielectric layer, a first conductive layer, and a second dielectric layer, the trench exposing a substrate and dividing the first conductive layer into a first portion associated with a first word line driver and a second portion associated with a second word line driver;
   depositing an insulative material into the trench;
   forming a first opening over a contact in contact with the substrate by etching a portion of the insulative material;

depositing, into the first opening, a chalcogenide material in contact with the first portion of the first conductive layer, the first dielectric layer, and the second dielectric layer;

depositing, into the first opening, a conductive material to form a pillar that contacts the chalcogenide material and contacts the substrate; and forming a second opening through the chalcogenide material and the conductive material to divide the chalcogenide material into a first chalcogenide component and a second chalcogenide component and divide the pillar into a first pillar and a second pillar.

2. The method of claim 1, further comprising:
depositing, into the second opening, a second insulative material that contacts the first chalcogenide component and the second chalcogenide component.

3. The method of claim 1, further comprising:
depositing a conformal material that contacts a first sidewall and a second sidewall of the trench, wherein depositing the insulative material into the trench is based at least in part on depositing the conformal material.

4. The method of claim 1, wherein the first chalcogenide component comprises a first wall contacting the first conductive layer, a second wall contacting a second insulative material, a third wall contacting the first pillar, and a fourth wall contacting a conformal material.

5. The method of claim 1, wherein forming the second opening through the chalcogenide material and the conductive material comprises:
performing a dry etching process to etch a second insulative material;
performing a selective wet etching process to divide the conductive material into the first pillar and the second pillar; and
performing a selective etching process to divide the chalcogenide material into the first chalcogenide component and the second chalcogenide component.

6. The method of claim 1, wherein:
the first pillar is formed over the contact extending through the substrate; and
the second pillar is formed over a second contact extending through the substrate.

7. The method of claim 1, further comprising:
depositing a second substrate over the first dielectric layer, the second substrate in contact with the first pillar and the second pillar, wherein the second substrate comprises a second contact extending through the second substrate and in contact with the first pillar, wherein the second pillar is in contact with the contact of the substrate.

8. The method of claim 1, further comprising:
forming a plurality of contacts extending through the substrate, the plurality of contacts is associated with a plurality of digit lines;
forming the first dielectric layer on the substrate;
forming the first conductive layer on the first dielectric layer, the first conductive layer configured as at least one word line plate; and
forming the second dielectric layer on the first conductive layer, wherein forming the trench is based at least in part on forming the second dielectric layer.

9. The method of claim 1, wherein:
the first pillar contacts at least one portion of the first dielectric layer, the second dielectric layer, and the first chalcogenide component; and
the second pillar contacts at least one portion of the first dielectric layer, the second dielectric layer, and the second chalcogenide component.

10. The method of claim 1, wherein the first pillar and the second pillar are configured as digit lines.

11. The method of claim 1, wherein forming the trench through the first dielectric layer comprises:
performing a vertical etching process to vertically etch the trench; and
performing a horizontal etching process after the vertical etching process to form at least one recess in the first conductive layer.

12. The method of claim 1, wherein the trench extends through the first conductive layer in a serpentine shape.

13. The method of claim 1, wherein the first chalcogenide component and the second chalcogenide component each comprise a storage element for a self-selecting memory cell.

* * * * *